(12) United States Patent
Edwards et al.

(10) Patent No.: US 7,961,054 B2
(45) Date of Patent: Jun. 14, 2011

(54) TIMING RECOVERY FOR PARTIAL-RESPONSE MAXIMUM LIKELIHOOD SEQUENCE DETECTOR

(75) Inventors: Jomo K. Edwards, Aliso Viejo, CA (US); Christopher A. Gill, Orange, CA (US); Devin K. Ng, Mission Viejo, CA (US); Harry H. Tan, Palos Verdes Estates, CA (US); Salam Elahmadi, Dallas, TX (US); Matthias Bussman, Los Angeles, CA (US)

(73) Assignee: Menara Networks, Inc., Dallas, TX (US)

( * ) Notice: Subject to any disclaimer, the term of this patent is extended or adjusted under 35 U.S.C. 154(b) by 53 days.

(21) Appl. No.: 12/260,043

(22) Filed: Oct. 28, 2008

(65) Prior Publication Data

US 2010/0102888 A1 Apr. 29, 2010

(51) Int. Cl.
*H03L 7/07* (2006.01)
(52) U.S. Cl. ............... 331/16; 360/51; 375/376
(58) Field of Classification Search .......... 331/16; 360/51; 375/376
See application file for complete search history.

(56) References Cited

U.S. PATENT DOCUMENTS

| 6,683,930 | B1* | 1/2004 | Dalmia ............... 375/376 |
| 2004/0146132 | A1* | 7/2004 | Staszewski et al. ...... 375/376 |
| 2008/0049350 | A1* | 2/2008 | Bruner et al. ............ 360/51 |
| 2010/0103791 | A1* | 4/2010 | Honma ............... 369/59.22 |

* cited by examiner

*Primary Examiner* — Robert Pascal
*Assistant Examiner* — James E Goodley
(74) *Attorney, Agent, or Firm* — Blakely Sokoloff Taylor & Zafman, LLP

(57) ABSTRACT

An embodiment of the present invention is a technique for timing recovery. A frequency acquisition loop locks a voltage controlled oscillator (VCO) clock of a multi-band VCO to a reference clock. The frequency acquisition loop generates first and second feedback clocks from the VCO clock. A data lock phase loop generates a driving signal corresponding to a phase error signal from interleaved partial response signal (PRS) samples based on the second feedback clock. The driving signal controls the multi-band VCO in a data phase lock mode. A lock detect controller detects a frequency lock condition in a frequency lock mode and a data lock condition in the data phase lock mode based on the first feedback clock and the reference clock.

38 Claims, 13 Drawing Sheets

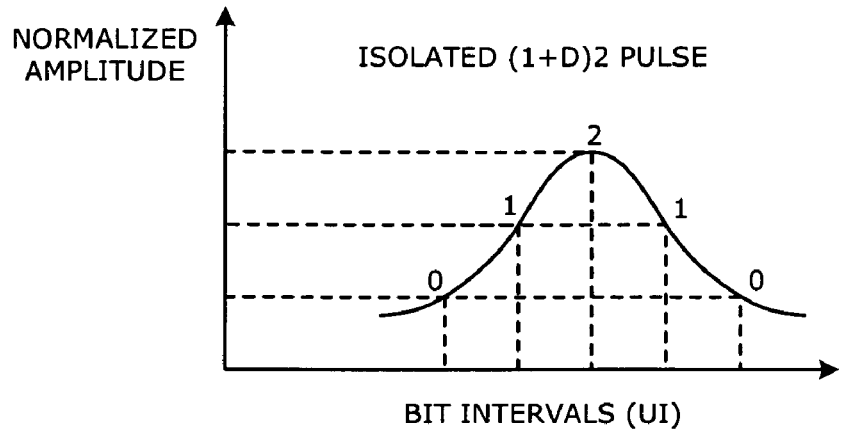
FIGURE 10B
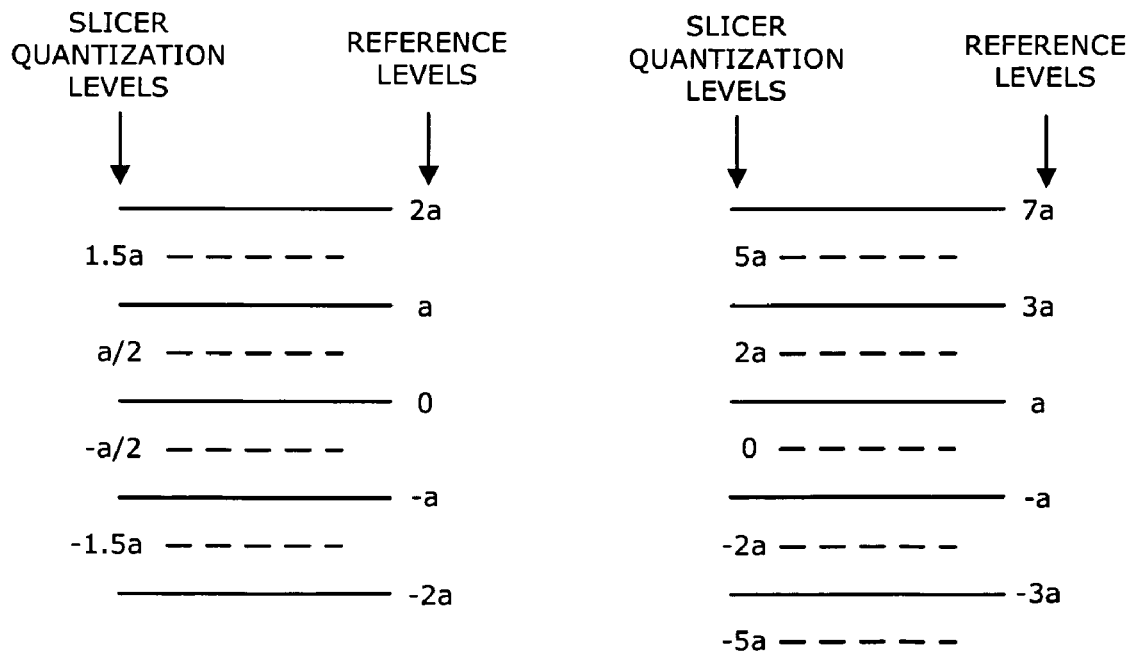
FIGURE 10C
FIGURE 10D

TIMING RECOVERY FOR PARTIAL-RESPONSE MAXIMUM LIKELIHOOD SEQUENCE DETECTOR

BACKGROUND

1. Field of the Invention

Embodiments of the invention relate to the field of optical communication, and more specifically, to timing recovery in optical transceivers.

2. Description of Related Art

High speed wave-division multiplexing (WDM) Single-Mode Fiber (SMF) optical communication links have extremely high bandwidths (i.e., $f_{BW} > 10$ THz for $\lambda = 1.5$ μm) but suffer from low spectral efficiency, approximately from 0.2 bit per second per Hertz (b/s/Hz) to 0.8 b/s/Hz for Non-Return-To-Zero (NRZ) modulation used on each wavelength. This is due to nonlinearities in the fiber core (e.g. Self-Phase Modulation, Cross-Phase Modulation, etc.) as well as other impairments such as Polarization-Mode Dispersion (PMD). This results in expensive pre, post, and in-line optical dispersion compensation modules for high data rates (e.g., baud rates $\geq 9.95$ Gb/s) on each wavelength in a fiber link. Therefore, high speed SMF links without Dispersion Compensation modules (DCM) are limited to reaches of approximately from 80 km to 120 km.

Extending the reach of SMF high speed links to 320 Km and beyond with no pre, post, or in-line DCMs may face many problems. The low signal-to-noise ratio (SNR) due to the nonlinearities may lead to timing errors. The timing errors may in turn result in poor performance of signal detection.

BRIEF DESCRIPTION OF THE DRAWINGS

Embodiments of invention may best be understood by referring to the following description and accompanying drawings that are used to illustrate embodiments of the invention. In the drawings:

FIG. 10B is a diagram illustrating a normalized amplitude of a class-2 partial signaling according to one embodiment of the invention.

FIG. 10C is a diagram illustrating a slicer quantization for the $(1+D)^2$ polynomial according to one embodiment of the invention.

FIG. 10D is a diagram illustrating a slicer quantization for the $1+1.5D+D^2$ polynomial according to one embodiment of the invention.

DESCRIPTION

Figure 1:
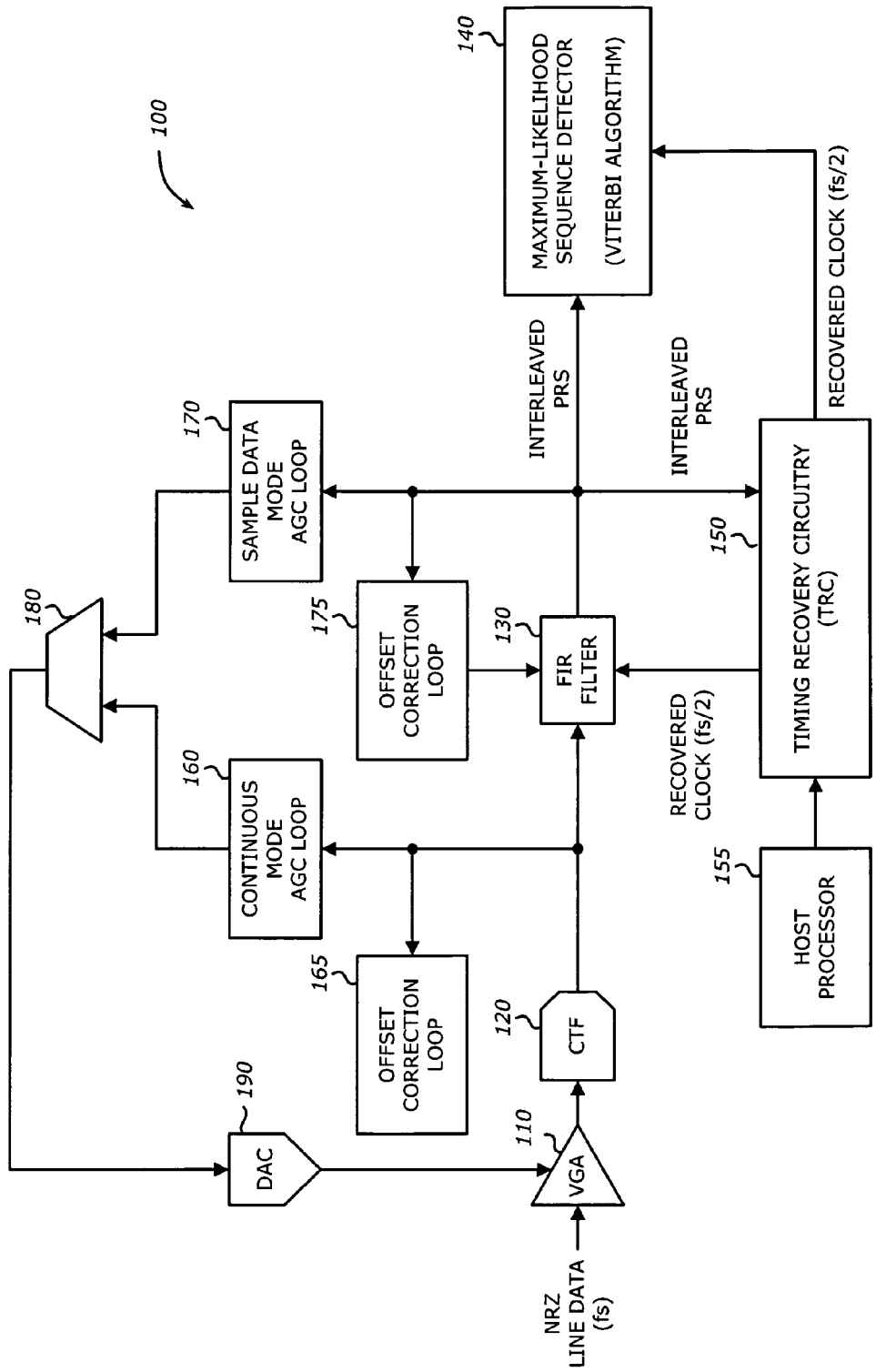
FIG. 1 is a diagram illustrating a system in which one embodiment of the invention may be practiced.

An embodiment of the present invention is a technique for timing recovery for a maximum likelihood sequence detector in an optical receiver. A frequency acquisition loop locks a voltage controlled oscillator (VCO) clock of a multi-band VCO to a reference clock. The frequency acquisition loop generates first and second feedback clocks from the VCO clock. A data lock phase loop generates a driving signal corresponding to a phase error signal from interleaved partial response signal (PRS) samples based on the second feedback clock. The driving signal controls the multi-band VCO in a data phase lock mode. A lock detect controller detects a frequency lock condition in a frequency lock mode and a data lock condition in the data phase lock mode based on the first feedback clock and the reference clock.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the invention is a timing recovery circuit (TRC) for a partial-response maximum-likelihood (PRML) sequence estimator (MLSE) for high-speed optical channels. The TRC may be a fully differential clock recovery block and may be implemented in 0.18 μm Silicon-Germanium (SiGe) bipolar complementary metal-oxide-semiconductor (BiCMOS). The TRC may be implemented as a dual loop phase locked loop (PLL). The dual loop architecture may include a traditional type-2 charge pump PLL for frequency acquisition, and a decision-directed least mean square (LMS) algorithm for phase acquisition. The decision-directed phase detector (DDPD) may use the minimum mean-squared error (MMSE) algorithm to extract the timing of each sample of a PRS. The architecture may be implemented for the following PRS: $D^2+2D+1$ and $D^2+1.5D+1$, but may be suitable for any partial-response (PR) polynomial. The TRC may support all Small Form Factor Pluggable Interface (XFI) data rates from 9.95 Gigabits per second (Gb/s) to 11.09 Gb/s, and data-rates as high as 12.5 Gb/s; at extremely low Signal-to-Noise Ratio (SNR) (e.g., 10 dB). It may dissipate 460 mW from a dual 3.3-V and 1.8-V supply. It may comply with or exceed all XFI receiver jitter specifications for telecom, such as the Synchronous Optical Network (SONET) OC-192 and G.709 "OTU-2" standards, and Datacom (Ethernet 802.3ae or Fiber Channel).

FIG. 1 is a diagram illustrating a system 100 in which one embodiment of the invention may be practiced. The system 100 represents an optical receiver. The system 100 may include a variable gain amplifier (VGA) 110, a continuous time filter (CTF) 120, a finite impulse response (FIR) filter 130, a maximum likelihood (ML) sequence detector 140, a TRC 150, a host processor 155, a continuous mode automatic gain control (AGC) loop 160, a sampled data mode AGC loop 170, a multiplexer 180, and a digital-to-analog converter (DAC) 190. The system 100 essentially employs a PRS modulation scheme with controlled inter-symbol interference (ISI) and smaller bandwidth coupled with the use of MLSE to recover from receiver degradation due to ISI. The PRS is produced by a discrete-time analog modulator which represents the channel response.

The VGA 110 is an AGC controlled low noise amplifier that receives a NRZ line optical data that operates at a frequency of $f_s$. The CTF 120 is a filter that equalizes the received data and may have a programmable cut off frequency optimized for the targeted PR polynomial. The transfer function of the FIR filter 130 as determined by the filter coefficients may be configured to equalize the output of the CTF 120 to the targeted PR polynomial at the correct sampling instant. In one embodiment, the FIR filter 130 has five taps. The FIR filter 130 may provide an interleaved PRS samples to the maximum likelihood sequence detector 140. The maximum likelihood sequence detector 140 may use the Viterbi algorithm (VA) as a detection method for data recovery. In order for the detector 140 to execute the VA, the proper timing of the data samples is extracted from the partial response signal. The TRC 150 extracts this timing information to provide the recovered clock to the detector 140 and the FIR filter 130. The host processor 155 may provide configuration data to initialize or configure the TRC 150 to operate in a pre-defined control mode. The offset correction loop 165 provides the offset correction for the CTF 120. The offset correction loop 175 provides the offset correction for the FIR filter 130. The continuous mode AGC loop 160 provides the gain for the continuous mode. The sampled data mode AGC loop 170 provides the gain for the sampled data mode. The multiplexer 180 selects the gain from the continuous mode AGC loop 160 and the sampled data mode AGC loop 170 to the DAC 190. The DAC 190 converts the digital gain value to the analog gain to control the VGA 110.

Figure 2:
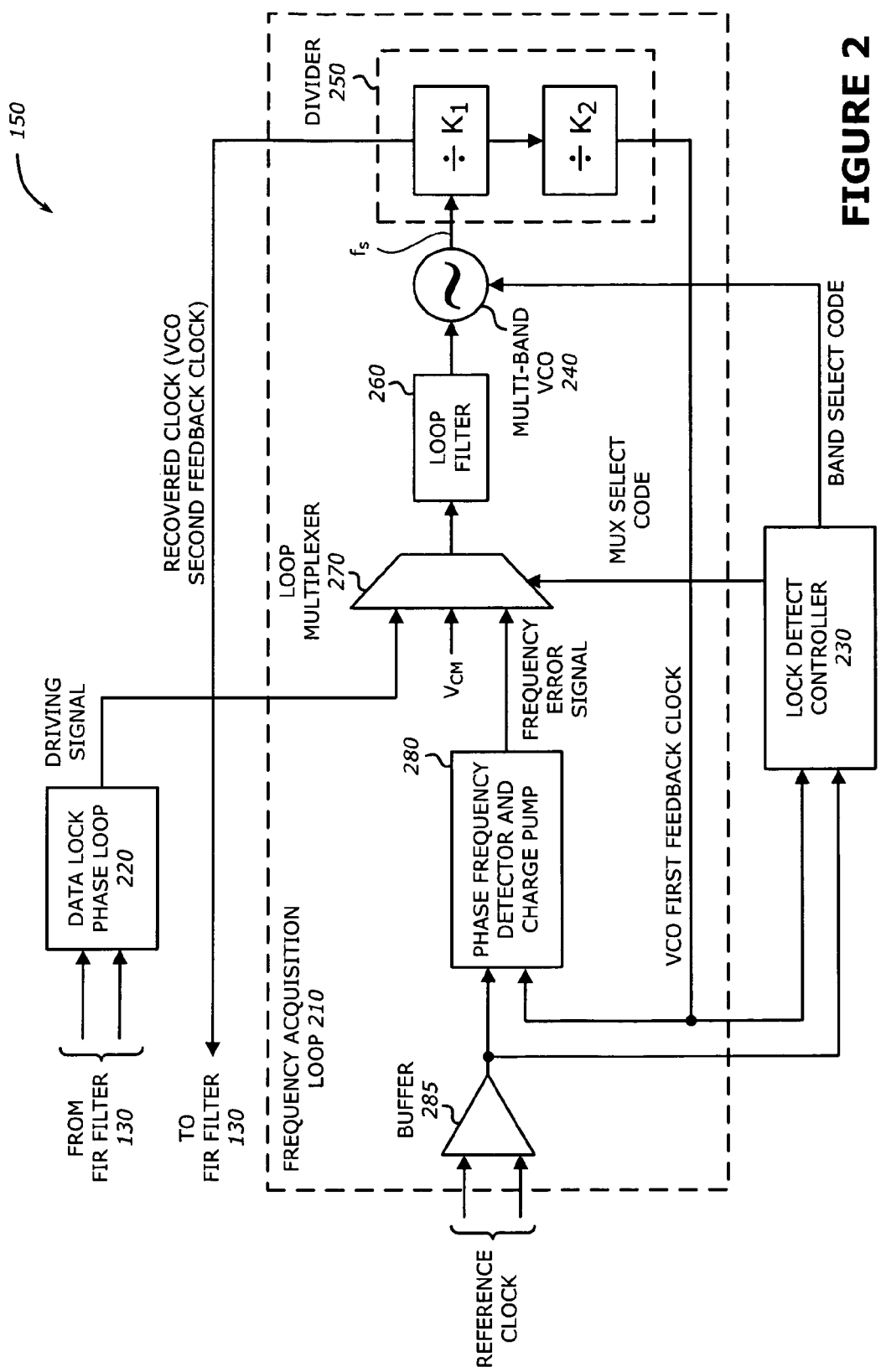
FIG. 2 is a diagram illustrating a timing recovery circuit according to one embodiment of the invention.

FIG. 2 is a diagram illustrating the timing recovery circuit (TRC) 150 shown in FIG. 1 according to one embodiment of the invention. The TRC 150 includes a frequency acquisition loop 210, a data lock phase loop 220, and a lock detect controller 230.

The frequency acquisition loop 210 is a circuit to lock a voltage controlled oscillator (VCO) clock of a multi-band VCO to a reference clock. Locking here refers to the ability to maintain the frequency difference between the VCO clock, or its derivatives, and the reference clock to within a pre-defined threshold value. The frequency acquisition loop 210 includes a multi-band VCO 240, a divider 250, a loop filter 260, a loop multiplexer 270, a phase-frequency detector and charge pump 280, and a buffer 285. The frequency acquisition loop 210 generates first and second feedback clocks from the VCO clock.

The multi-band VCO 240 may be a LC-tank VCO that may cover all XFI supported data rates, e.g., from 9.95 Gb/s to 11.30 Gb/s, while maintaining a relatively clean output spectrum. Its random noise contribution may be less than 1.0 ps (RMS) at a minimum loop bandwidth of approximately 4.0 MHz. It may be formed by a differential square inductor across a fixed capacitor and two variable capacitors. A metal oxide semiconductor (MOS) varactor may be used for fine tuning and a bank of capacitors may be used for coarse frequency adjustment. The coarse tuning capacitors may be distributed over a L-bit binary digital-to-analog converter (DAC). In one embodiment, the multi-band VCO 240 may have a 16 different operating frequency bands corresponding to a 4-bit band select code for the 4-bit DAC. The frequency of the clock output of the multi-band VCO 240 is $f_s$ when it is locked to the reference clock.

The divider 250 may include a counting circuit that divides the VCO clock to provide a VCO first feedback clock and a VCO second feedback clock. The first feedback clock is fed back to the phase-frequency detector and charge pump 280 for phase-frequency detection in a typical phase-locked loop (PLL) circuit. It may also be provided to the lock detect controller 230 for frequency lock and data phase lock controls. The second feedback clock may be the recovered clock that is provided to the data lock phase loop 220 and the FIR filter 130. In one embodiment, the divider 250 includes a divide-by-K1 and a divide-by-K2. The first feedback clock, therefore, has a frequency of $f_s/(K1*K2)$. The second feedback frequency has a frequency of $f_s/K1$. In one embodiment, K1=2 and K2=32.

The loop filter 260 is coupled to the multi-band VCO 240 to filter a control signal. The filtered control signal controls the multi-band VCO.

The loop multiplexer 270 is coupled to the loop filter 260 to select the control signal from a common mode signal $V_{CM}$, a frequency error signal, and a driving signal based on a multiplexer select code. The multiplexer select code may be provided by the lock detect controller 230 to allow the loop multiplexer 270 to select the appropriate control signal from the common mode signal $V_{CM}$, the frequency error signal, and the driving signal. The loop multiplexer 270 allows the frequency acquisition loop 210 to lock the VCO clock with the reference clock using one of the three sources of control signal. The common mode signal $V_{CM}$ is used during frequency lock using coarse tuning mode. The common mode signal is a pre-determined signal that has a proper value, e.g., $V_{CM}=0$, to set the multi-band VCO to operate in the center of its operating frequency band. The frequency error signal is used during frequency lock using fine tuning mode. The frequency error signal is provided by the phase-frequency detector and charge pump 280 in a normal PLL operation. The driving signal is used during the data phase lock mode when the frequency lock by the frequency acquisition loop is disconnected and the data lock phase loop 220 takes over.

The buffer 285 buffers the differential reference. It may be optional if the reference clock is adequately buffered. The phase frequency detector (PFD) and a charge pump is coupled to the loop multiplexer 270 and the divider 250 to provide the frequency error signal based on the reference clock and the first feedback clock.

The data lock phase loop 220 is a circuit that is coupled to the frequency acquisition loop 210 to generate a driving signal corresponding to a phase error signal from the interleaved PRS samples based on the second feedback clock. The driving signal controls the multi-band VCO in a data phase lock mode.

The lock detect controller 230 provides two main modes of operations: a frequency lock mode and a data phase lock mode. The frequency lock mode is the mode where the VCO clock is locked with the reference clock using a fixed control signal or the phase frequency detector and the charge pump 280. In the frequency lock mode, there are two sub-modes a coarse tuning mode and a fine tuning mode. The coarse tuning mode is used in calibration where a zone lock frequency band of the multi-band VCO is selected to be the closest to the reference clock using the fixed control signal, the common mode signal, or the $V_{CM}$. The fine tuning mode is the mode where the VCO clock is locked to the reference clock using the frequency error signal from the phase frequency detector and the charge pump 280 with the zone lock frequency band selected in the coarse tuning mode. The data phase lock mode is the mode where the VCO clock is locked to the reference clock using the driving signal from the data lock phase loop 220.

The lock detect controller 230 is a circuit that is coupled to the frequency acquisition loop to detect a frequency lock condition in the frequency lock mode and a data lock condition in the data phase lock mode based on the first feedback clock and the reference clock. The lock detect controller 230 may have interface to the host processor 155 to receive configuration bits. The host processor 155 may write control words to and read status words from the lock detect controller 230. Examples of these control words may include mode control bits to set parameters (e.g., gain), to bypass the coarse tuning mode, to bypass the frequency lock mode, or to force a data phase lock mode, or to force a frequency lock mode while the TRC 150 is in the data phase lock mode.

Figure 3:
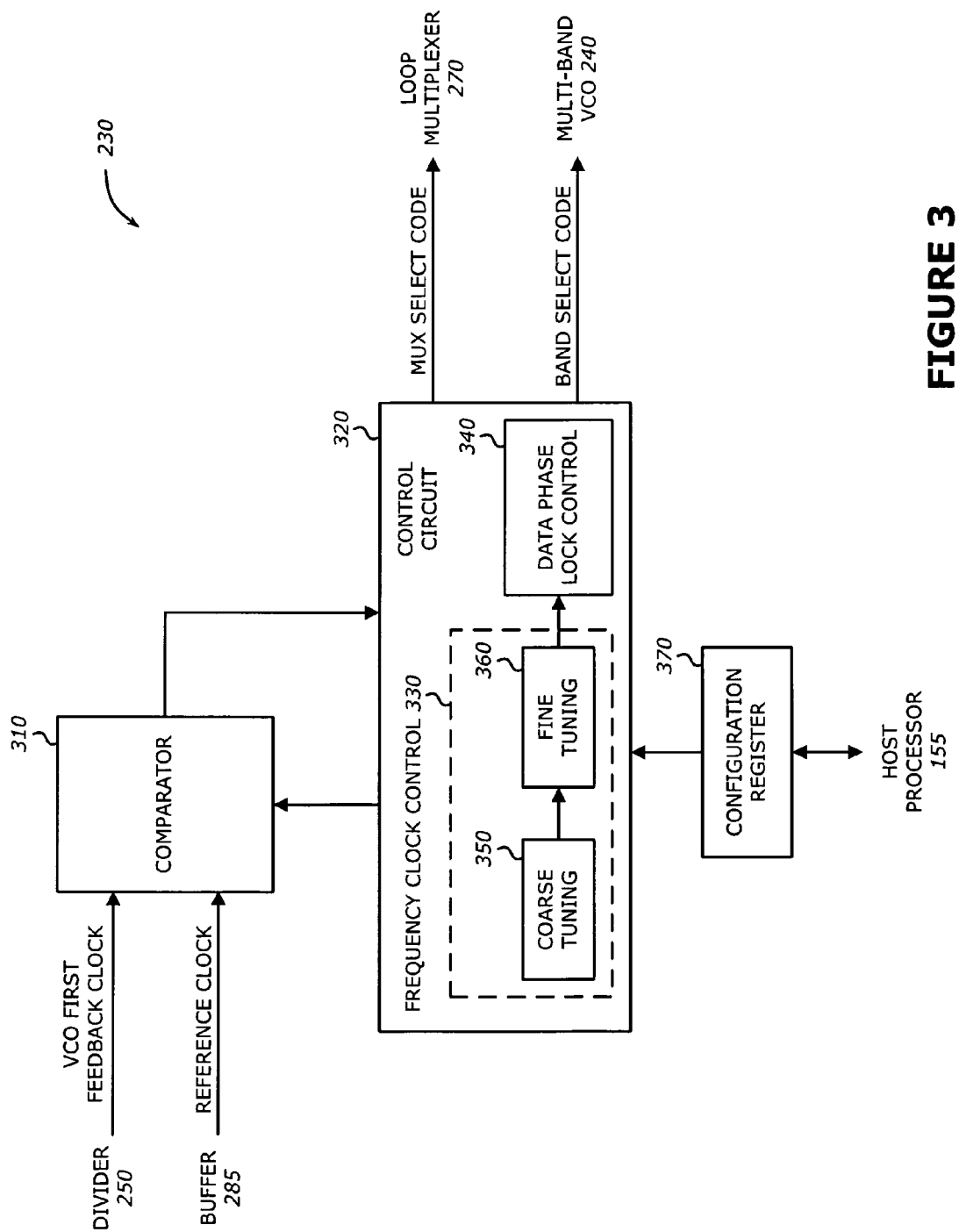
FIG. 3 is a diagram illustrating a lock detect controller according to one embodiment of the invention.

FIG. 3 is a diagram illustrating the lock detect controller 230 shown in FIG. 2 according to one embodiment of the invention. The lock detect controller 230 includes a comparator 310, a control circuit 320, and a configuration register 370.

The comparator 310 compares the first feedback clock from the divider 250 and the reference clock. The comparator 310 may include a counter and a comparator circuit to compare the frequencies of the first feedback clock from the divider 250 and the reference clock. The comparator 310 generates a lock signal when the frequency difference of first feedback clock and the reference clock is less than a threshold value. The threshold value may be programmable through the configuration register as written by the host processor 155. The lock signal may also be used to select the zone lock frequency band during the coarse tuning mode when the control circuit traverses the bands of the multi-band VCO.

The control circuit 320 is coupled to the comparator 310 to generate the multiplexer select code to the loop multiplexer 270 and the band select code to the multi-band VCO 240 based on the lock signal and configuration bits. The control circuit 320 includes a frequency lock control circuit 330 and a data phase lock control circuit 340. The frequency lock control circuit 330 is used for frequency lock and includes a frequency coarse tuning circuit 350 and a frequency fine tuning circuit 360.

The frequency coarse tuning circuit 350 selects a zone lock frequency band from a plurality of frequency bands of the multi-band VCO. The zone lock frequency band has a smallest frequency difference between the first feedback clock and the reference clock. The frequency fine tuning circuit 360 is coupled to the frequency coarse tuning circuit 350 to assert or de-assert the frequency lock condition using the selected zone lock frequency band.

The data phase lock control circuit 340 is coupled to the frequency fine tuning circuit 360 to assert or de-assert the data phase lock condition The configuration register 370 is coupled to the control circuit 320 to provide the configuration bits. The configuration bits may include control words or bits that configure or initialize the control circuit 320. Examples of these control words or bits may include bits to set parameters, bypass the coarse tuning mode, and bypass the frequency lock mode, etc. Several control bits or words may be defined to implement the control mode for the TRC 150. These control bits or words may include SET_ZONE, ZONE_LOCK, ZONE_STABLE, DLOCK, FLOCK, AMP_LOCK, TRC_FORCE_AMPLCK, FORCE_DLOOP, FORCE_FLOCK, and FORCE_FLOOP. These control bits or words allow the control circuit 320 to set frequency band (using SET_ZONE) of the VCO 240, flags for coarse mode (e.g., ZONE_LOCK and ZONE_STABLE), flags for locking condition (using FLOCK and DLOCK), bypass or force mode (using FORCE_DLOOP, FORCE_FLOCK, and FORCE_FLOOP), etc. Examples of using these control bits or words are discussed in the following.

In one embodiment, the coarse frequency tuning mode may be bypassed by selecting the VCO frequency curve using a host write. The value to be written is driven onto SET_ZONE<3:0>. Once the value of SET_ZONE is loaded into the configuration register 370, ZONE_LOCK and ZONE_STABLE are set to prevent the block from going back to coarse frequency tuning mode. Whenever the ZONE is written, the lock detect controller 230 may be forced to the fine frequency mode and DLOCK and FLOCK may be forced to the logic '0'. Once the zone is written, one way to re-enter the coarse tuning mode is to reset the lock detect controller 230.

Once the TRC 150 has acquired frequency lock, ZONE_LOCK and FLOCK are true. The lock detect controller 230 will switch the loop multiplexer 270 giving control of the multi-band VCO 240 to the data phase lock loop 220. The same algorithm used during fine frequency tuning to declare and undeclared a lock condition is now used for the data loop. Even though the loop multiplexer 270 has switched and the VCO phase is following the data the locking algorithm may not be initiated until the AGC coarse loop has locked (AMP_LOCK=1) or declared via the host processor 155 (TRC_FORCE_AMPLCK=1).

During the data phase lock mode, data lock is declared once the frequency difference is within the specified range and the DLOCK signal is asserted. Just like the fine frequency lock, if data lock is not achieved within a pre-defined number of times (e.g., N2), control is passed back to the fine frequency loop and FLOCK is de-asserted. Once data lock is achieved, the data phase lock loop may continue to execute. It may take N2 consecutive "unlocks" to force DLOCK low. If this occurs, control may be passed back to the fine frequency tuning mode and FLOCK is de-asserted.

The TRC 150 may also be forced into the data phase lock mode using the FORCE_DLOOP control bit. When the FORCE_DLOOP control bit is asserted high, FLOCK may be asserted high and the block may enter the data phase lock mode provided that the TRC 150 is not already forced to the frequency loop (FORCE_FLOCK=1). It may stay in data phase lock mode as long as FORCE_DLOOP is asserted and FORCE_FLOOP remains low. If FORCE_DLOOP is cleared, the block may stay in data phase lock mode as long as phase lock is maintained. If data lock is lost, the block will return to fine frequency loop. If FORCE_DLOOP is asserted, AMP_LOCK is ignored. Assertion of FORCE_FLOOP may cause the TRC 150 to immediately exit the data phase lock mode and both DLOCK and FLOCK signals may be cleared; it may enter the fine frequency loop and stay there or re-enter coarse frequency tuning mode if required. As long as it is asserted, the block may not be able to go back to the data phase lock mode. The FORCE_DLOOP signal is ignored if the FORCE_FLOOP signal is asserted.

Figure 4:
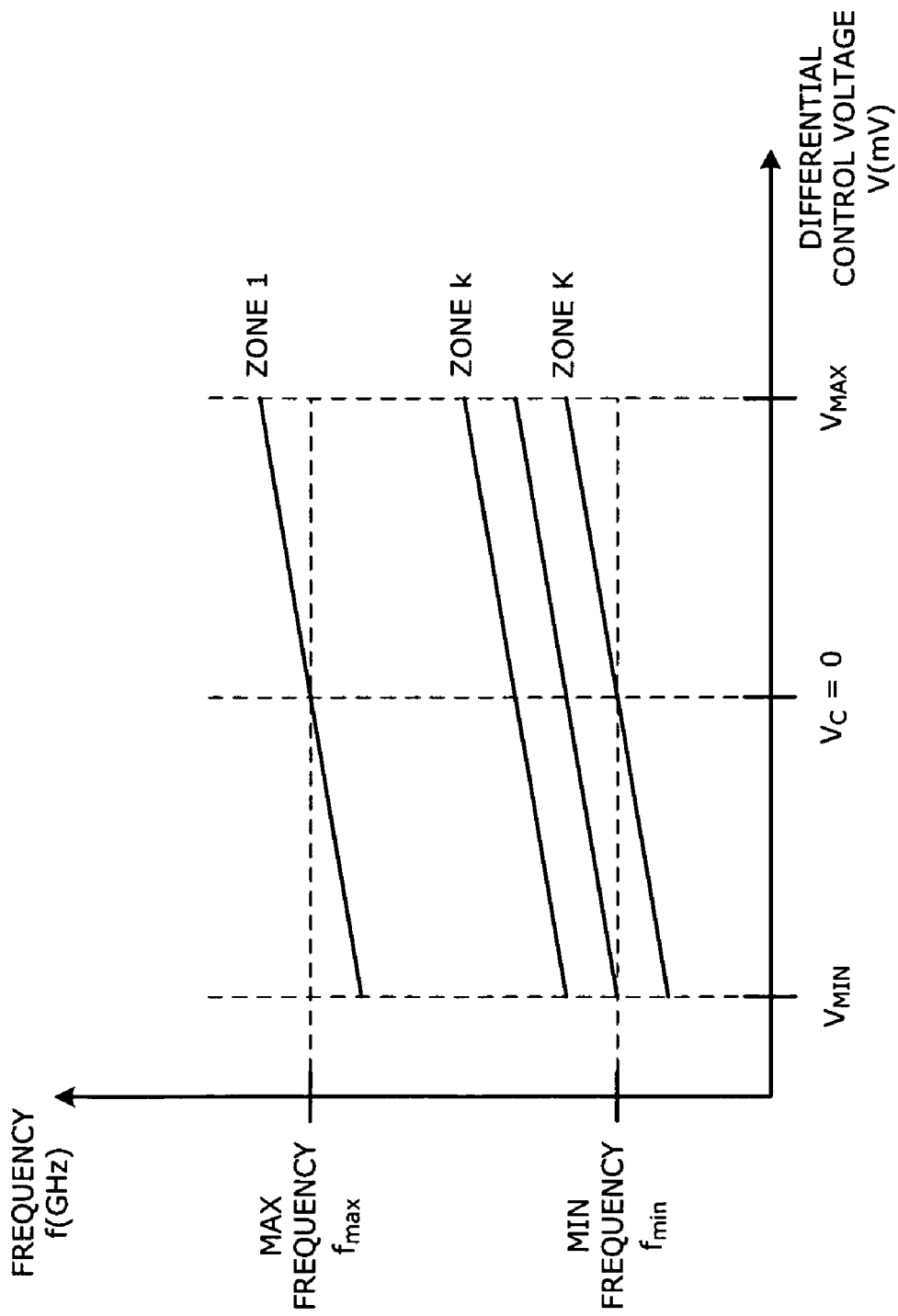
FIG. 4 is a diagram illustrating operating frequency bands of the multi-band VCO according to one embodiment of the invention.

FIG. 4 is a diagram illustrating operating frequency bands of the multi-band VCO according to one embodiment of the invention. The diagram shows the frequency of the VCO in GHz as a function of the differential control voltage V in mV. The frequency of the VCO clock may range from a minimum frequency $f_{min}$ to a maximum frequency $f_{max}$. The control voltage may range from a minimum voltage $V_{min}$ to a maximum voltage $V_{max}$. There may be K bands or zones of frequency bands as selected by the band select code that is applied to the DAC that control the LC tank circuit in the multi-band VCO 240.

When the control voltage is the common mode voltage, e.g., $V_{CM}=0$, the frequency is typically at the center of the band. During the coarse tuning mode, the common mode signal is used to control the VCO. The control circuit 320 in the lock detect controller 230 sequences through the bands and compares the frequencies of the resulting first feedback clock with the reference clock. The band that has the smallest frequency difference will be selected as the zone lock frequency band which will be used for the fine tuning mode.

The frequency lock mode may be bypassed by a control bit in the configuration register 370 (FIG. 3) written by the host processor 155. This control bit forces a data phase lock mode. If frequency lock mode is bypassed, the control circuit 320 will proceed directly to the data phase lock control mode. In the frequency lock mode, the coarse tuning mode may also be bypassed by another control bit in the configuration register 370 written by the host processor 155. If coarse tuning mode is bypassed, the host processor 155 also writes a SET_ZONE word which corresponds to a band select code to select the operating band in the multi-band VCO 240 (FIG. 2).

During the frequency lock fine tuning mode, frequency lock is declared when the frequency difference between the VCO first feedback clock and the reference clock is less than a pre-defined threshold $T_F$ while the multi-band VCO 240 is controlled by the frequency error signal from the phase-frequency detector and charge pump 280 (FIG. 2). In one embodiment, this threshold $T_F$ is 122 ppm. To ensure stable operation, this frequency lock condition may be checked for N1 times where N1 is a pre-determined positive integer. In one embodiment, N1 is equal to 4. If the frequency lock condition is not maintained for at least N1 times, the control circuit 320 returns to the coarse tuning mode.

During the data phase lock mode, data phase lock is declared when the frequency difference between the VCO first feedback clock and the reference clock is less than a pre-defined threshold $T_D$ while the multi-band VCO 240 is controlled by the driving signal from the data lock phase loop 220 (FIG. 2). In one embodiment, this threshold $T_D$ is 122 ppm. To ensure stable operation, this data phase lock condition may be checked for N2 times where N2 is a pre-determined positive integer. In one embodiment, N2 is equal to 4. If the data phase lock condition is not maintained for at least N2 times, the control circuit 320 returns to the fine tuning mode. In addition, the threshold $T_D$ may be selectable through the configuration register. In one embodiment, there are four selectable threshold values: 122 ppm, 244 ppm, 488 ppm, and 976 ppm.

Figure 5:
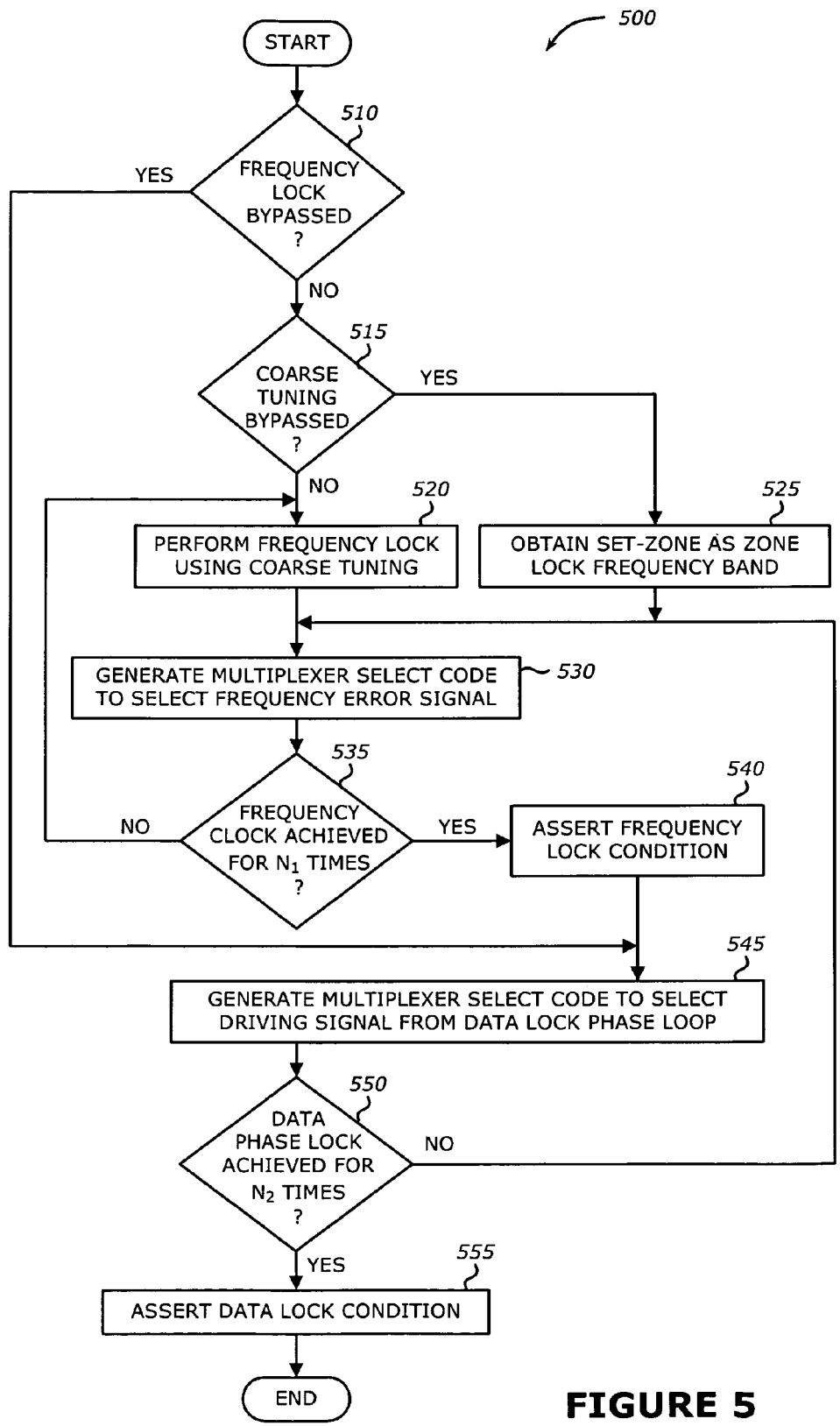
FIG. 5 is a flowchart illustrating a process to control the frequency lock and data lock according to one embodiment of the invention.

FIG. 5 is a flowchart illustrating a process 500 to control the frequency lock and data lock according to one embodiment of the invention.

Upon START, the process 500 determines if it is desired to bypass the frequency lock (Block 510). This may be performed by checking the control or configuration bits in the configuration register. If so, the process 500 proceeds to block 545 to perform the data phase lock. Otherwise, the process 500 determines if it is desired to bypass the coarse tuning mode (Block 515). If so, the process 500 obtains the SET_ZONE word as written in the configuration register as the zone lock frequency band (Block 525) and proceed to block 530. Otherwise, the process 500 performs the frequency lock using the coarse tuning mode (Block 520). The details of block 520 are shown in FIG. 6.

Then, the process 500 generates the multiplexer select code to select the frequency error signal (Block 530). Next, the process 500 determines if the frequency lock has been achieved for N1 times (Block 535). As mentioned above, frequency lock is declared when the frequency difference between the VCO first feedback clock and the reference clock is less than a pre-defined threshold $T_F$ while the multi-band VCO 240 is controlled by the frequency error signal from the phase-frequency detector and charge pump 280. If a frequency lock is not achieved for N1 times, the process 500 returns to Block 520. Otherwise, the process 500 asserts the frequency lock condition (Block 540).

Next, the process 500 generates the multiplexer select code to select the driving signal from the data lock phase loop (Block 545). Next, the process 500 determines if the data phase lock has been achieved for N2 times (Block 550). As mentioned above, data phase lock is declared when the frequency difference between the VCO first feedback clock and the reference clock is less than a pre-defined threshold $T_D$ while the multi-band VCO 240 is controlled by the driving signal from the data lock phase loop 220. If a data phase lock is not achieved for N2 times, the process 500 returns to Block 530. Otherwise, the process 500 asserts the data phase lock condition (Block 555) and is then terminated.

Figure 6:
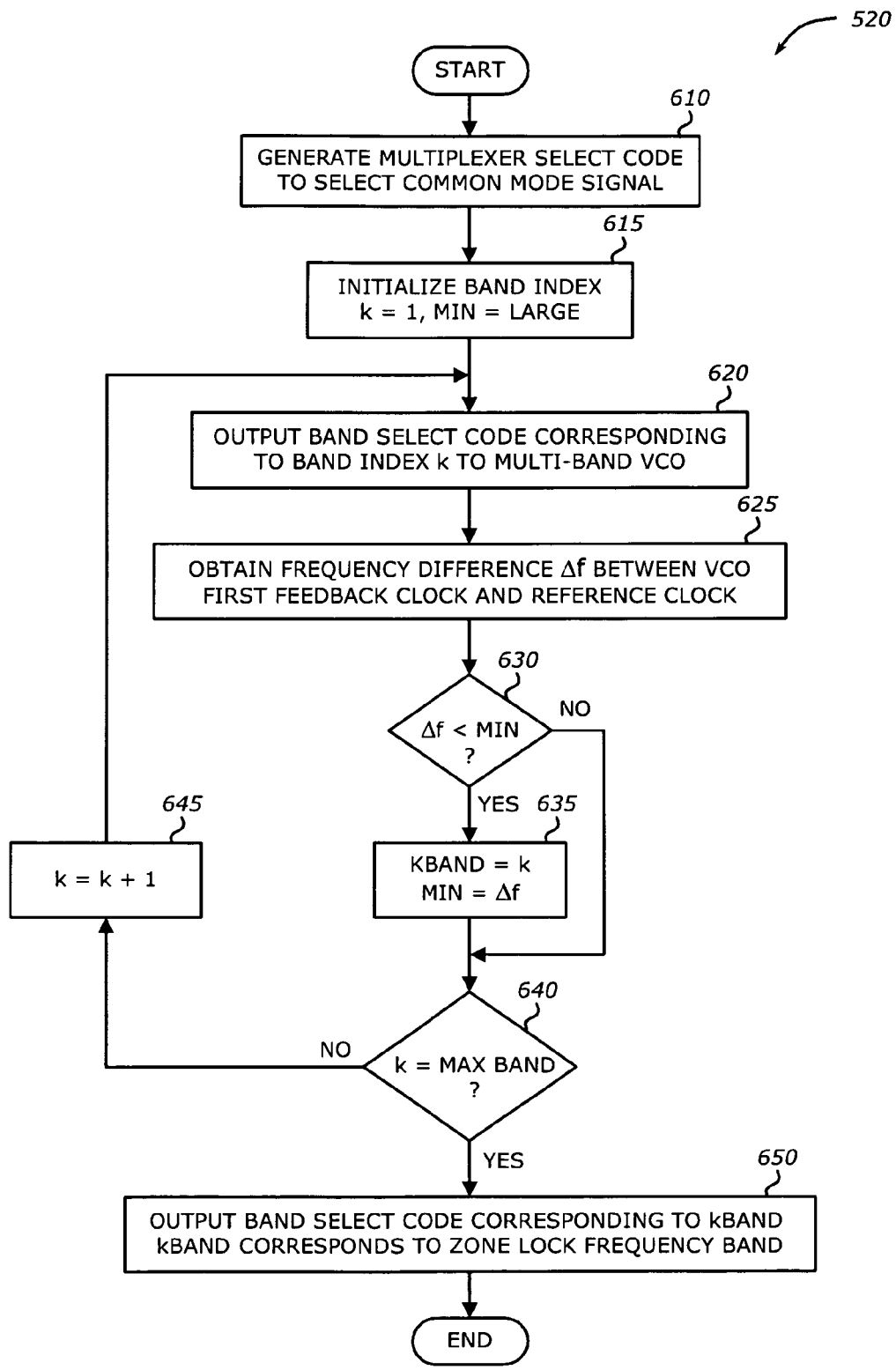
FIG. 6 is a flowchart illustrating a process to perform frequency lock using coarse tuning according to one embodiment of the invention.

FIG. 6 is a flowchart illustrating the process 520 shown in FIG. 5 to perform frequency lock using coarse tuning according to one embodiment of the invention.

Upon START, the process 520 generates the multiplexer select code to select the common mode signal (Block 610). Then, the process 520 initializes the band (or zone) index k=1 and initializes the MIN variable to a very large number LARGE (Block 615). Next, the process 520 outputs the band select code corresponding to the index k to the multi-band VCO (Block 620). The multi-band VCO then produces the clock using the band or zone selected by this band select code as illustrated in FIG. 4.

Then, the process 520 obtains the frequency difference $\Delta f$ between the VCO first feedback clock and the reference clock. Next, the process 520 determines if $\Delta f$ is less than MIN. If not, the process 520 proceeds to Block 640. Otherwise, the process 520 sets kband to k and MIN to $\Delta f$ (Block 635). Then, the process 520 determines if all bands have been traversed by comparing the index k with the MAXBAND value where MAXBAND is the total number of bands (Block 640). If not, the process 520 increments the band index k to k+1 to go to the next band (Block 645) and goes to Block 620. Otherwise, all bands have been traversed and the process 520 outputs the band select code corresponding to the kband. (Block 650) The kband value corresponds to the zone lock frequency band that is used for the frequency lock fine tuning mode. The process 520 is then terminated.

Figure 7A:
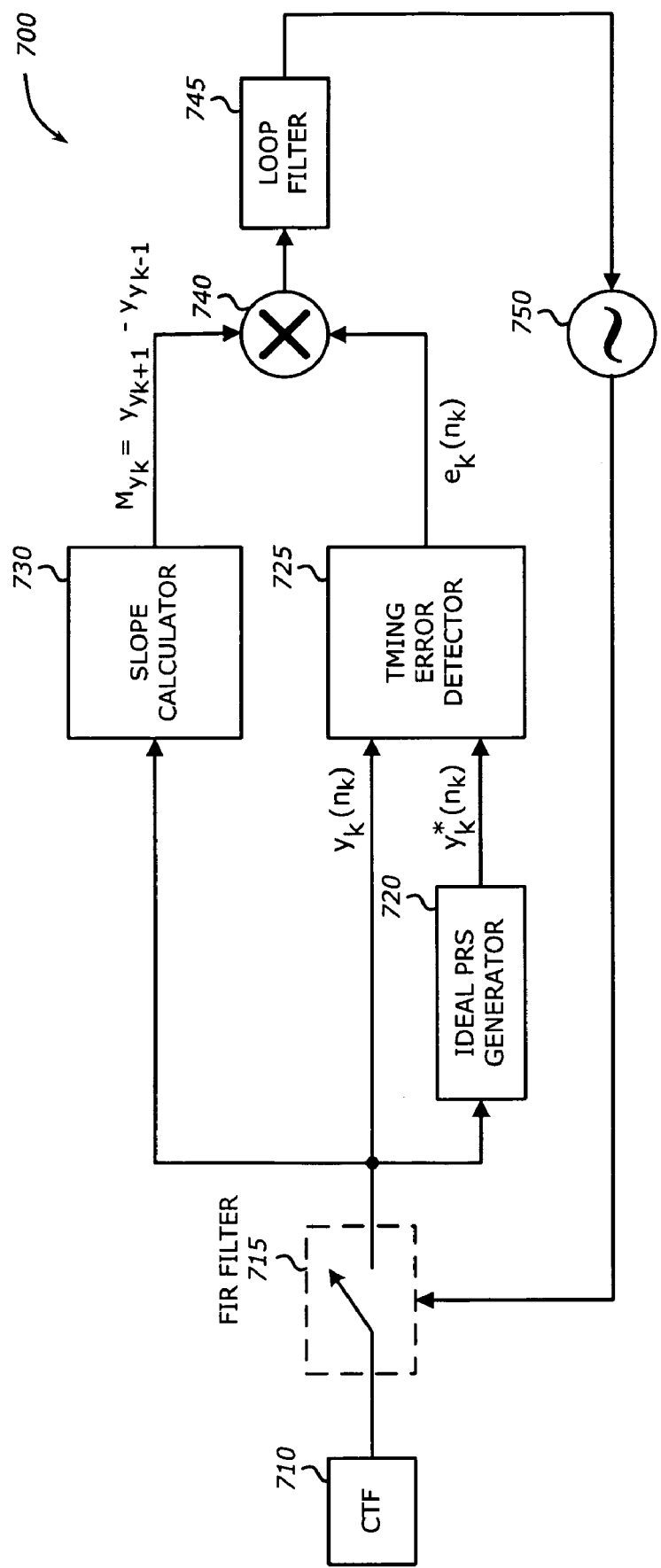
FIG. 7A is a diagram illustrating an MMSE phase detector according to one embodiment of the invention.

FIG. 7A is a diagram illustrating an MMSE phase detector 700 according to one embodiment of the invention. The TRC 150 implements an MMSE-based timing recovery. The MMSE-based timing recovery is an application of the Least-Mean Square (LMS) adaptation technique to acquire phase in a sampled data clock recovery system. Essentially, the timing information may be obtained as the instantaneous gradient with respect to phase of an error signal that is proportional to the phase. The derivation of the MMSE algorithm is based on the following equations.

$$e_k = y^*_k - y_k \tag{1}$$

$$\text{MSE} = E\{e_k^2\} = \int_{-\infty}^{\infty} e_k^2 pdf(y_k) dy_k \tag{2}$$

$$de_k^2/dn_k = -2e_k(n_k)[dy(t)/dt]_{t=kT+nk} \tag{3}$$

$$z_k = e_k \times (y_{k+1} - y_{k-1}) \tag{4}$$

In the above equations, $e_k$ is the error between the ideal data sample $y^*_k$ and the received sample $y_k$. MSE is the mean square error. $E\{\alpha\}$ is the expected operator, which corresponds to taking the mean or average of the argument $\alpha$. To determine the minimum, first the derivative of the squared error is obtained via equation (3), and then this derivative is equated to zero to solve for $z_k$ by equation (4).

The MMSE phase detector 700 includes a CTF 710, a FIR filter 715, an ideal PRS generator 720, a timing error detector 725, a slope calculator 730, a multiplier 740, a loop filter 745, and a VCO 750. The MMSE phase detector 700 represents a typical circuit to recover the clock using the MMSE criteria. This general scheme may be implemented in the system 100 where the CTF 710 corresponds to the CTF 120; the FIR filter 715 corresponds to the FIR filter 130; the ideal PRS generator 720, the timing error detector 725, and the slope calculator 730 correspond to components of the data lock phase loop 220 shown in FIG. 2 as will be explained further in the following; the loop filter 745 corresponds to the loop filter 260, and the VCO corresponds to the multi-band VCO 240.

The CTF 710 receives the NRZ data. The impulse response of the CTF 710 is such that the output y(t), when sampled at the appropriate phase yields a sequence that corresponds to the targeted PR polynomial. The FIR filter 715 equalizes the output y(t) of the CTF 710 to the targeted PR polynomial at the correct sampling instant using an interleaved PRS. The FIR filter 715 is sampled at the time $(kT+(n_k+T_j)$ where T is the timing interval, $n_k$ represents the optimal timing offset for the optimal sample phase of sample k, and $T_j$ is the timing jitter. The ideal PRS generator 720 provides the ideal response $y^*_k$ that is closest to the PRS sample as provided by the FIR filter 715. The timing error detector 725 computes the error $e_k = y^*_k - y_k$ based on equation (1). The minimum MSE is found by setting the derivative with respect to the sampling time as in (2) to zero and setting the timing jitter to zero. The minimum occurs when the product of the amplitude error $e_k(n_k)$ for sample k and the slope of the sample at time k is equal to zero. The slope calculator 730 calculates this slope $M_{yk}$ of the sample. The multiplier 740 multiplies the amplitude error $e_k(n_k)$ and the slope $M_{yk}$. The result is a driving signal that drives the linear transconductor ($g_m$) and then the loop filter 745 which in turn provides a control voltage to control the VCO 750. The driving signal reflects the output of the multiplier 740.

Figure 7B:
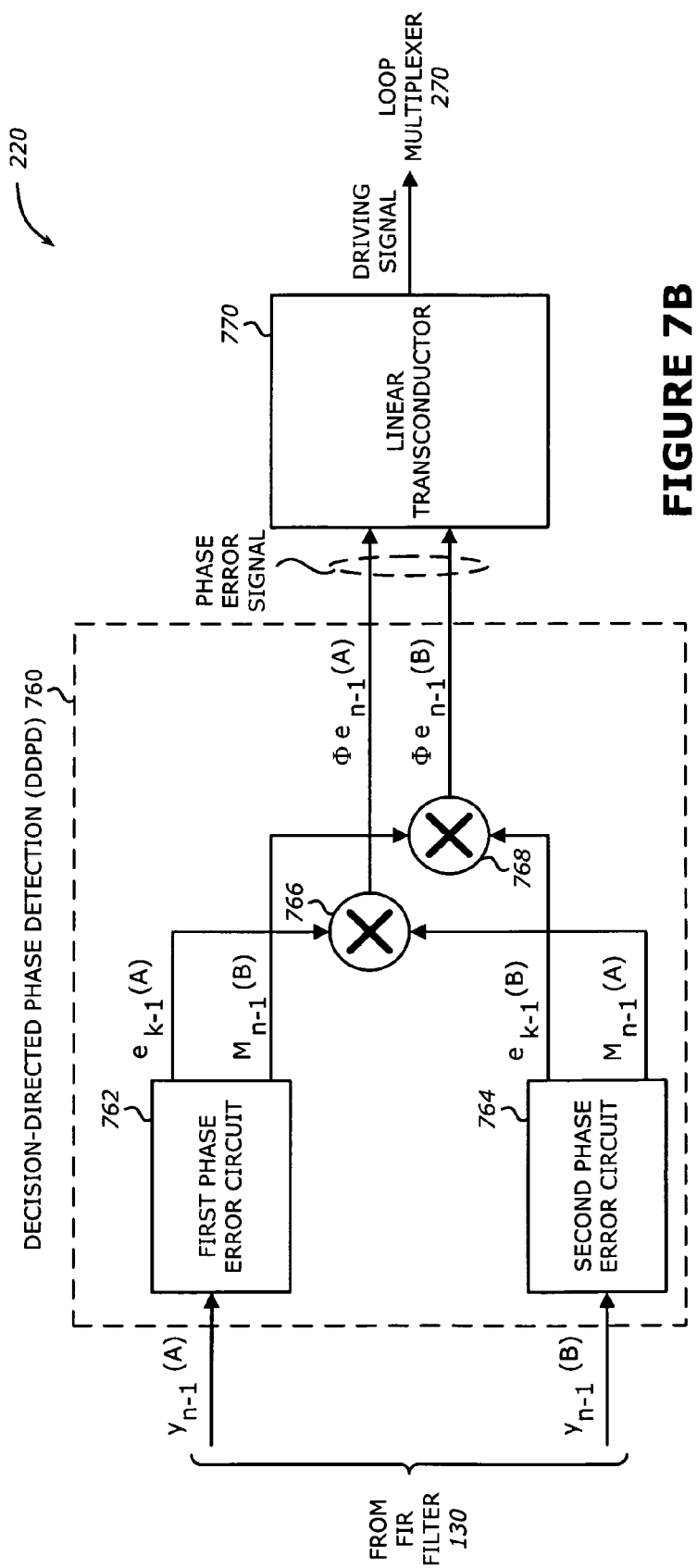
FIG. 7B is a diagram illustrating a data lock phase loop according to one embodiment of the invention.

FIG. 7B is a diagram illustrating the data lock phase loop 220 shown in FIG. 2 according to one embodiment of the invention. The data lock phase loop 220 includes a decision-directed phase detector (DDPD) 760 and a linear trans-conductor 770.

The DDPD 760 is coupled to the FIR filter 130 (FIG. 1) which is clocked by the second feedback clock to generate the phase error signal using the MMSE criteria. The phase error signal includes first and second phase error signals $\phi e_{n-1}(A)$ and $\phi e_{n-1}(B)$, respectively. The DDPD 760 includes a first phase error circuit 762, a second phase error circuit 764, a first multiplier 766, and a second multiplier 768.

The first phase error circuit 762 generates a first re-timed amplitude error $e_{k-1}(A)$ and a first re-timed binary slope $M_{n-1}(B)$ from a first data sample $y_{n-1}(A)$ from the FIR filter 130. The second phase error circuit 764 generates a second re-timed amplitude error $e_{k-1}(B)$ and a second re-timed binary slope $M_{n-1}(A)$ from a second data sample $y_{n-1}(B)$ from the FIR filter 130. The first and second data samples $y_{n-1}(A)$ and $y_{n-1}(B)$ may correspond to even and odd data samples, or an in-phase (0-degree) and out-of-phase (180-degree) data samples. The two phase error circuits 762 and 764 operate on interleaved data from the FIR filter 130. They have essentially identical structures and clocked by the same VCO second feedback clock.

The first multiplier 766 multiplies the first re-timed amplitude error $e_{k-1}(A)$ and the second re-timed binary slope $M_{n-1}(A)$ to generate the first phase error signal $\phi e_{n-1}(A)$. The second multiplier 768 multiplies the second re-timed amplitude error $e_{k-1}(B)$ and the first re-timed binary slope $M_{n-1}(B)$ to generate the second phase error signal $\phi e_{n-1}(B)$.

The linear trans-conductor 770 is coupled to the DDPD 760 to generate a differential current from the phase error signal which includes the first phase error signal $\phi e_{n-1}(A)$ and the second phase error signal $\phi e_{n-1}(B)$. The differential current corresponds to the driving signal that controls the multi-band VCO 240 (FIG. 2).

Figure 8:
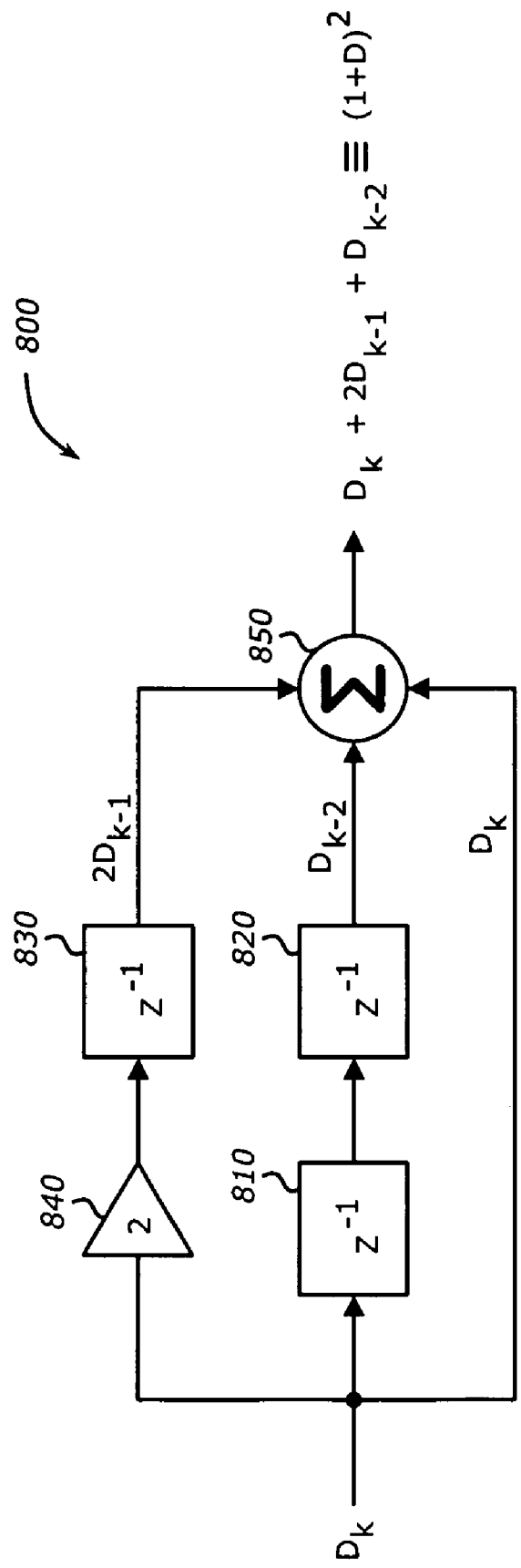
FIG. 8 is a diagram illustrating a partial response circuit according to one embodiment of the invention.

FIG. 8 is a diagram illustrating a partial response circuit 800 according to one embodiment of the invention. The partial response circuit 800 includes three delay elements 810, 820, and 830, an amplifier or a gain multiplier 840, and a summer 850.

The input to the partial response circuit 800 is $D_k$. The resulting output is $D_k + 2D_{k-1} + D_{k-2}$. It is known that a delay is equivalent to a multiplication. Therefore, factoring $D_k$ will provide the output to be $1 + 2D + D^2 = (1+D)^2$. Similar circuit may be realized for different partial response polynomial.

Figure 9:
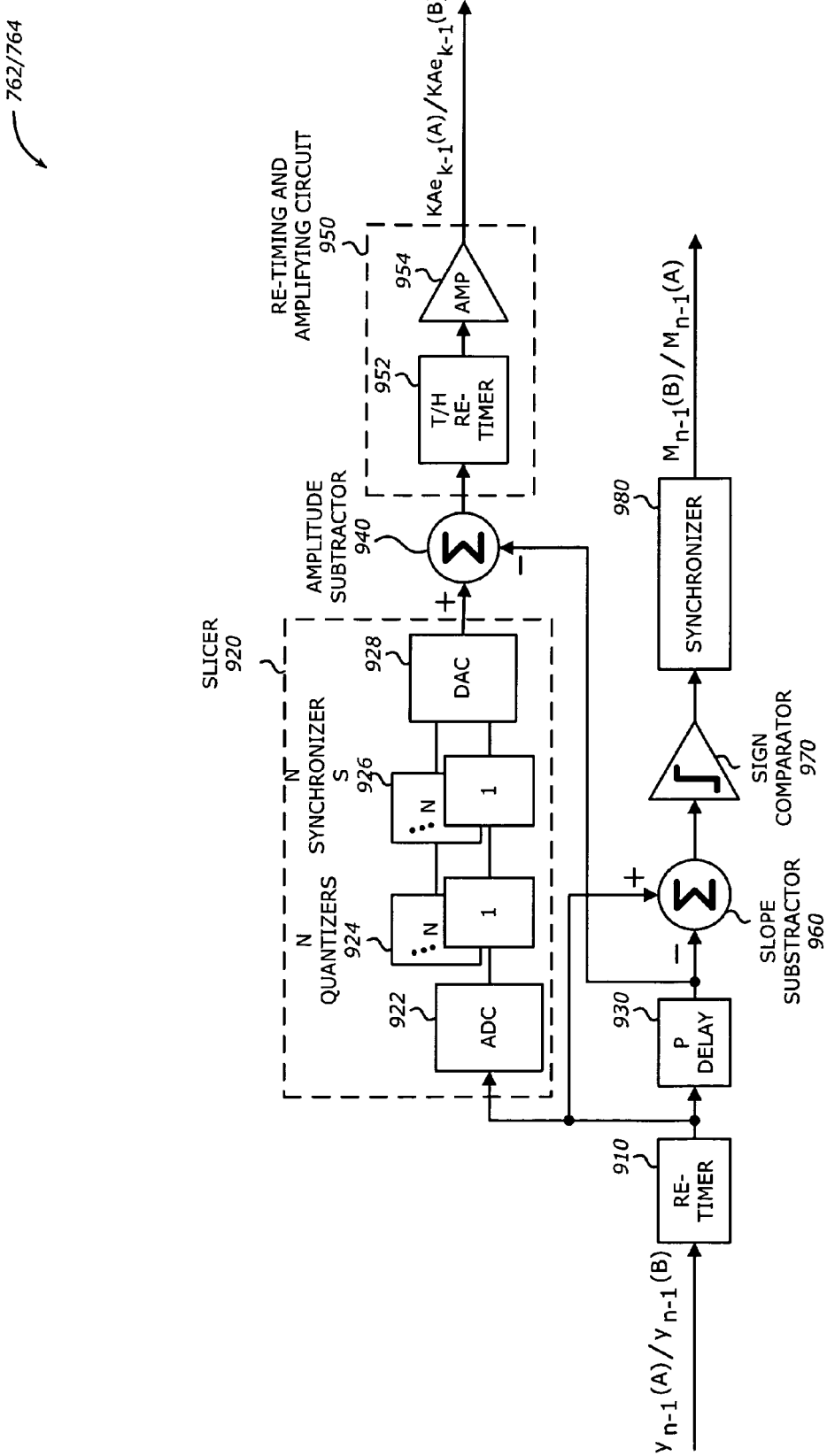
FIG. 9 is a diagram illustrating a phase error circuit according to one embodiment of the invention.

FIG. 9 is a diagram illustrating the first phase error circuit 762 or the second phase error circuit 764 according to one embodiment of the invention. As mentioned earlier, the two circuits have identical structures except that they operate on interleaved data samples. The phase error circuit 762/764 includes a re-timer 910, a slicer 920, a delay 930, an amplitude subtractor 940, a re-timing and amplifying circuit 950, a slope subtractor 960, a sign comparator 970, and a synchronizer 980. All of the clocked devices in the phase error circuit 762/764 may be clocked by the same clock signal, the VCO second feedback clock. It is contemplated that the phase error circuit 762/764 may include more or less than the above elements.

The re-timer 910 adjusts the first/second data sample $y_{n-1}(A)/y_{n-1}(B)$ to a sample y(n). The re-timer 910 may be implemented as a track-and-hold (T/H) device clocked by the VCO second feedback clock to re-time, or delay, the analog discrete-time partial response signal from the FIR filter 130. This re-timing may eliminate any skew or timing error introduced at the FIR filter interface.

The slicer 920 essentially generates the ideal PRS sample as the ideal PRS generator 720 (FIG. 7A). It is coupled to the re-timer 910 to generate a delayed ideal data sample $y^*(n-P)$ which is delayed by P cycles from the sample y(n). The number of delay cycles P may be a pre-determined number which may correspond to the number of taps in the FIR filter 130. In one embodiment, the number of taps in the FIR filter is 5 and P=2. The slicer 920 includes an analog-to-digital converter (ADC) 922, N quantizers 924, N synchronizers 926, and a digital-to-analog converter (DAC) 928. The ADC converts the analog discrete samples y(n) to N data. The N quantizers 924 quantize the data into N levels. The number N of the levels depends on the partial signal target polynomial. For $(1+D)^2$, N=5. For $1+1.5D+D^2$, N=6. The function of the N quantizers 924 is to map the sample y(n) to the value closest to it, or to generate an ideal sample. The N synchronizers 926 re-time or synchronize the sample to correspond to the calculated slope that takes place in the opposite interleaved branch. The DAC 928 converts the N samples into a single analog sample which now represents $y^*(n-P)$.

The delay 930 delays the sample y(n) to y(n-P). The delay 930 may be implemented by P T/H devices clocked by the VCO second feedback clock. In one embodiment, P=2 and the delay 930 includes two T/H devices in series.

The amplitude subtractor 940 essentially performs similar function as the timing error detector 725 (FIG. 7A). It is coupled to the slicer 920 and the delay 930 to generate an amplitude error $Ae_n$. The amplitude error $Ae_n$ is equal to $y*(n-P)-y(n-P)$.

The re-timing and amplifying circuit 950 re-times and amplifies the amplitude error $Ae_n$, to generate the re-timed amplitude error $KAe_{n-1}$. The re-timing and amplifying circuit 950 includes a re-timer 952 and a gain amplifier 954. The re-timer 952 may be implemented as a T/H device. In one embodiment, the gain K is equal to 2.

The slope subtractor 960, the sign comparator 970, and the synchronizer 980 essentially perform the same function as the slope calculator 730 (FIG. 7A). The slope subtractor 960 is coupled to the delay 930 and the re-timer 910 to generate a difference between $y(n-P)$ and $y(n)$. The sign comparator 970 is coupled to the slope subtractor 960 to generate a sign of the difference. This may be implemented as a thresholder, a comparator, or a one-bit quantizer, which produces the sign of the difference. The sign indicates the direction of the phase error, while the amplitude error represents the magnitude of the error. The result is $M_n=\pm 1$. The synchronizer 980 is coupled to the sign comparator 970 to generate the re-timed binary slope $M_{n-1}$ which is synchronous with the re-timed amplitude error $KAe_{n-1}$.

Figure 10A:
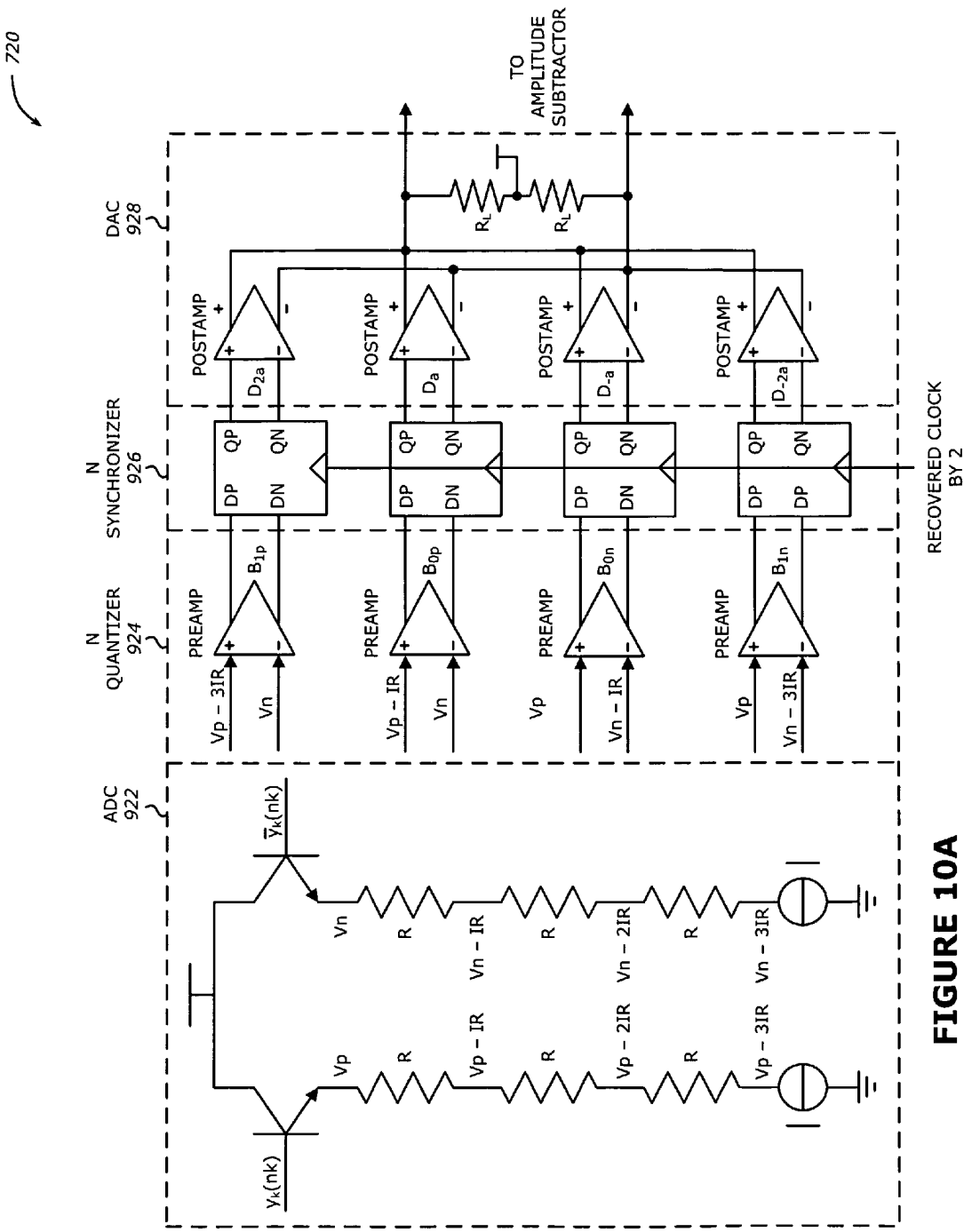
FIG. 10A is a diagram illustrating a circuit implementation of the slicer according to one embodiment of the invention.

FIG. 10A is a diagram illustrating a circuit implementation of the slicer 920 according to one embodiment of the invention. As discussed above, the slicer 920 includes the ADC 922, N quantizers 924, N synchronizers 926, and the reconstruction DAC 928. As discussed above, the output of the slicer is the receiver's best estimate of the input sample to the PS polynomial, e.g., $(1+D)^2$. The ideal equalization to the $D^2+2D+1$ target yields five discrete equally sampled signal levels: $\{0, \pm 1, \pm 2\}$. The slicer maps $y_n$ to one of these signal levels.

The ADC 922 may be implemented as two (±) 5 G samples/sec two-bit flash ADCs whose digital output words are concatenated to drive the 4-bit reconstruction DAC 928. Suppose the differential peak-to-peak value of the PRS is 900 mV, the full scale range of the input to the ADC 922 is 900 mV, resulting in a quantization level of a=900 mV/4=225 mV. Therefore, the discrete signal levels are $\{0, \pm 225, \pm 450\}$. The output of the emitter-follower buffer drives the ADC reference ladder which subdivides the main reference, which is the sample value itself, into the necessary voltage levels needed for comparison. The bias current of the buffer is inversely proportional to the resistance of the ladder, providing constant signal swings across processing corners. The reference levels are located at the average value of the two adjacent levels.

The N quantizers 924 may be implemented by amplifier comparators. They may be non-inverting bipolar differential amplifiers with resistive loads used as one-bit quantizers. The comparators' outputs may be expressed as:

$B_{1p}=1$ if $\Delta V>3IR$, 0 otherwise.

$B_{0p}=1$ if $\Delta V>IR$, 0 otherwise.

$B_{1n}=1$ if $\Delta V>-3IR$, 0 otherwise.

$B_{0n}=1$ if $\Delta V>-IR$, 0 otherwise.

where $\Delta V=Vp-Vn$.

The N synchronizers 926 may be implemented by N D flip-flops. The reconstruction DAC 928 may be implemented by N post amplifiers whose outputs are tied together to form a summing point. The input word to the reconstruction DAC 928 is $\{D_{2a}, D_a, D_{-a}, D_{-2a}\}$. Each bit turns on its corresponding post-amplifier that provides a quarter of the current needed for full scale (e.g., Vout=900 mV=IR). The zero level is automatically provided by the ADC 922 through a natural form of interpolation. As an example, if $B_{0p}$ and $B_{0n}$ are both false (e.g., logic 0), then the sample under measurement is $-112.5$ mV$<y_n<112.5$ mV, resulting in $\{D_{2a}, D_a, D_{-a}, D_{-2a}\}$=0000 and zero differential output current. The MSB's ($B_{1p}$, $B_{1n}$ are only true when their corresponding LSB's are true.

FIG. 10B is a diagram illustrating a normalized amplitude of a class-2 partial signaling according to one embodiment of the invention. The normalized amplitude shows the $(1+D)^2$ pulse as a function of the bit intervals.

FIG. 10C is a diagram illustrating a slicer quantization for the $(1+D)^2$ polynomial according to one embodiment of the invention. The slicer quantization levels are $-1.5a, -a/2, a/2,$ and $1.5a$. The corresponding reference levels are $-2a, -a, 0, a, 2a$. The quantization levels are approximately at the middle of the two respective adjacent reference levels.

FIG. 10D is a diagram illustrating a slicer quantization for the $1+1.5D+D^2$ polynomial according to one embodiment of the invention. Similarly, the slicer quantization levels are $-5a, -2a, 0, 2a,$ and $5a$. The corresponding reference levels are $-7a, -3a, -a, a, 3a,$ and $7a$. The 6-level quantizer may be implemented in a similar manner as the 5-level quantizer. The ideal output of a modulator is $\{\pm 1, \pm 3, \pm 7\}$. Using the same slicer architecture, the resistor ladder may be modified to generate the correct reference levels and equation at the comparator input. One additional comparator is needed which extends the DAC code by one more bit.

Figure 11:
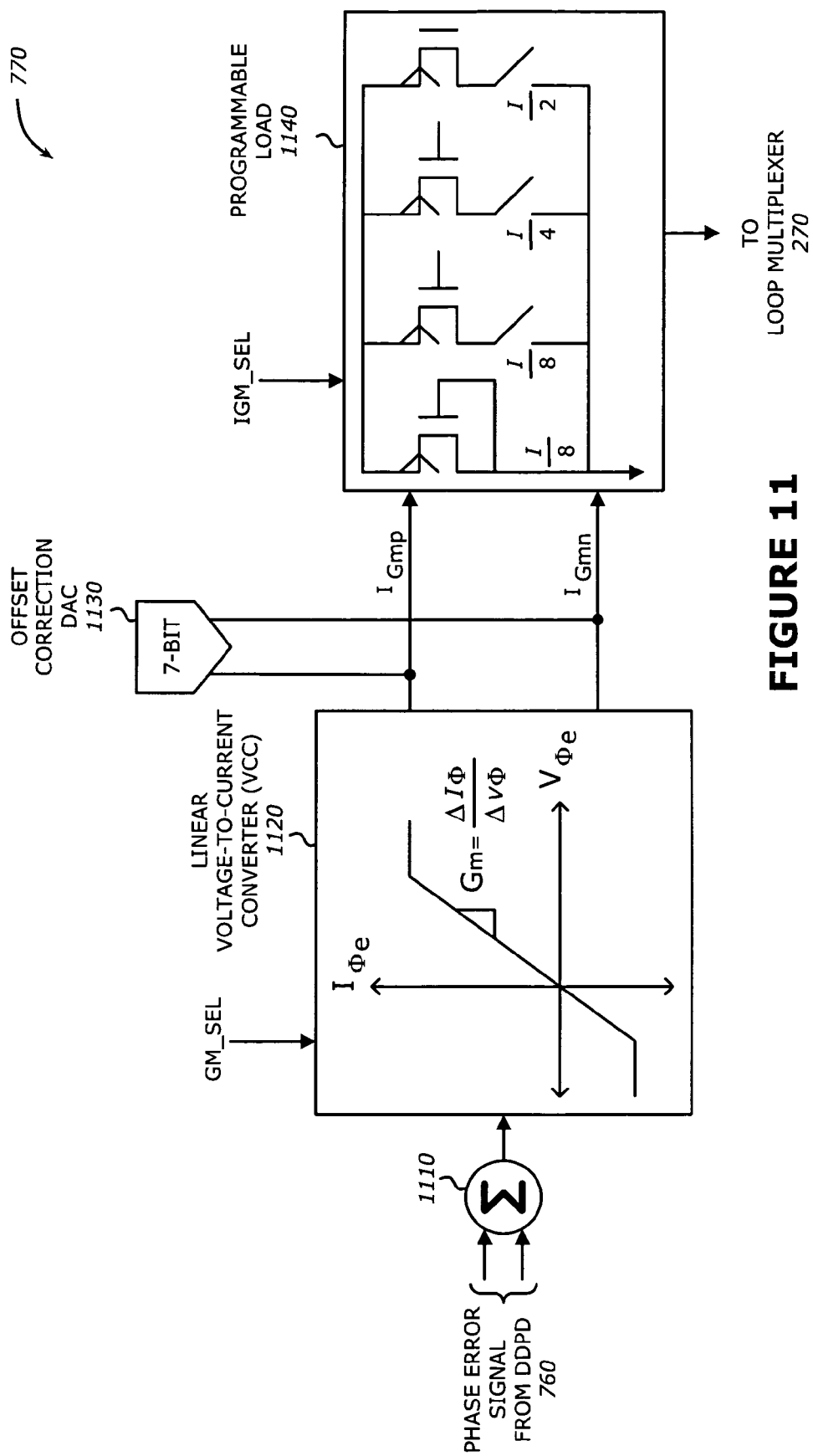
FIG. 11 is a diagram illustrating a linear transconductor according to one embodiment of the invention.

FIG. 11 is a diagram illustrating the linear transconductor 770 shown in FIG. 7 according to one embodiment of the invention. The transconductor 770 includes a summer 1110, a linear voltage-to-current converter (VCC) 1120, an offset corrector 1130, and a programmable load 1140. The primary function of the linear transconductor 770 is to produce a differential current that is linearly proportional to the phase error signals generated by the DDPD 760. Since the linear transconductor 770 is within the clock recovery feedback loop, its individual bandwidth may be at least 10 times greater than the overall loop bandwidth in order to preserve the loop stability.

The summer 1110 adds the two phase errors $\phi e_{n-1}(A)$ and $\phi e_{n-1}(B)$ from the DDPD 710. The VCC 1120 converts the differential voltages into currents. The transconductance of the linear conversion may be selected by the GM_SEL word. In one embodiment, the GM_SEL is a 2-bit word. The offset corrector 1130 corrects the offset to adjust the currents to the proper level. It may be implemented by a 7-bit DAC. The programmable load 1140 provides a programmable gain. The gain may be selected by the IGM_SEL word. In one embodiment, the IGM_SEL is a 3-bit word to provide 8 gain levels. The output of the programmable load 1140 is the drive signal that is used to drive the loop filter 260 (FIG. 2).

Elements of one embodiment of the invention may be implemented by hardware, firmware, software or any combination thereof. The term hardware generally refers to an element having a physical structure such as electronic, electromagnetic, optical, electro-optical, mechanical, electromechanical parts, etc. A hardware implementation may include analog or digital circuits, devices, processors, applications specific integrated circuits (ASICs), programmable logic devices (PLDs), field programmable gate arrays (FPGAs), or any electronic devices. The term software generally refers to a logical structure, a method, a procedure, a program, a routine, a process, an algorithm, a formula, a function, an expression, etc. The term firmware generally refers to a logical structure, a method, a procedure, a program, a routine, a process, an algorithm, a formula, a function, an expression, etc., that is implemented or embodied in a hardware structure (e.g., flash memory, ROM, EPROM). Examples of firmware may include microcode, writable control store, micro-programmed structure. When implemented in software or firmware, the elements of an embodiment of the present invention are essentially the code segments to perform the necessary tasks. The software/firmware may include the actual code to carry out the operations described in one embodiment of the invention, or code that emulates or simulates the operations. The program or code segments can be stored in a processor or machine accessible medium or transmitted by a computer data signal embodied in a carrier wave, or a signal modulated by a carrier, over a transmission medium. The "processor readable or accessible medium" or "machine readable or accessible medium" may include any medium that may store, transmit, receive, or transfer information. Examples of the processor readable or machine accessible medium that may store include a storage medium, an electronic circuit, a semiconductor memory device, a read only memory (ROM), a flash memory, an erasable programmable ROM (EPROM), a floppy diskette, a compact disk (CD) ROM, an optical disk, a hard disk, etc. Examples of the processor readable or machine accessible medium that may transmit, receive, or transfer information include a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc. The machine accessible medium may be embodied in an article of manufacture. The machine accessible medium may include information or data that, when accessed by a machine, cause the machine to perform the operations or actions described above. The machine accessible medium may also include program code, instruction or instructions embedded therein. The program code may include machine readable code, instruction or instructions to perform the operations or actions described above. The term "information" or "data" here refers to any type of information that is encoded for machine-readable purposes. Therefore, it may include program, code, data, file, etc.

All or part of an embodiment of the invention may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a frequency acquisition loop to lock a voltage controlled oscillator (VCO) clock in a zone lock frequency band from a plurality of frequency bands of a multi-band VCO to a reference clock, the frequency acquisition loop generating first and second feedback clocks from the VCO clock, the zone lock frequency band having a smallest frequency difference between the first feedback clock and the reference clock;
   a data lock phase loop coupled to the frequency acquisition loop to generate a driving signal corresponding to a phase error signal from interleaved partial response signal (PRS) samples based on the second feedback clock, the driving signal controlling the multi-band VCO in a data phase lock mode; and
   a lock detect controller coupled to the frequency acquisition loop to detect a frequency lock condition in a frequency lock mode and a data lock condition in the data phase lock mode based on the first feedback clock and the reference clock;
   wherein the frequency acquisition loop comprises:
   a divider to divide the VCO clock to provide the first and second feedback clocks;
   a loop filter coupled to the multi-band VCO to filter a control signal, the filtered control signal controlling the multi-band VCO;
   a loop multiplexer coupled to the loop filter to select the control signal from a common mode signal, a frequency error signal, and the driving signal based on a multiplexer select code; and
   a phase frequency detector (PFD) and a charge pump coupled to the loop multiplexer and the divider to provide the frequency error signal based on the reference clock and the first feedback clock.

2. The apparatus of claim 1 wherein the lock detect controller comprises:
   a comparator to compare the first feedback clock and the reference clock, the comparator generating a lock signal when a frequency difference of first feedback clock and the reference clock is less than a threshold value;
   a control circuit coupled to the comparator to generate the multiplexer select code and band select code to the multi-band VCO based on the lock signal and configuration bits; and
   a configuration register coupled to the control circuit to provide the configuration bits.

3. The apparatus of claim 2 wherein the control circuit comprises:
   a frequency coarse tuning circuit to select the zone lock frequency band from the plurality of frequency bands of the multi-band VCO;
   a frequency fine tuning circuit coupled to the frequency coarse tuning circuit to assert or de-assert the frequency lock condition using the selected zone lock frequency band; and a data phase lock control circuit coupled to the frequency fine tuning circuit to assert or de-assert the data lock condition.

4. The apparatus of claim 2 wherein the control circuit generates the multiplexer select code to the loop multiplexer to select the common mode signal, a frequency error signal, and the driving signal corresponding to the frequency coarse tuning circuit, the frequency fine tuning circuit, and the data phase lock control circuit, respectively.

5. The apparatus of claim 1 wherein the data lock phase loop comprises:
a decision-directed phase detector (DDPD) coupled to a finite impulse response (FIR) filter clocked by the second feedback clock to generate the phase error signal using a minimum mean square error (MMSE) criteria, the phase error signal including first and second phase error signals; and
a linear trans-conductor coupled to the DDPD to generate a differential current from the phase error signal, the differential current corresponding to the driving signal that controls the multi-band VCO.

6. An apparatus comprising:
a frequency acquisition loop to lock a voltage controlled oscillator (VCO) clock in a zone lock frequency band from a plurality of frequency bands of a multi-band VCO to a reference clock, the frequency acquisition loop generating first and second feedback clocks from the VCO clock, the zone lock frequency band having a smallest frequency difference between the first feedback clock and the reference clock;
a data lock phase loop coupled to the frequency acquisition loop to generate a driving signal corresponding to a phase error signal from interleaved partial response signal (PRS) samples based on the second feedback clock, the driving signal controlling the multi-band VCO in a data phase lock mode; and
a lock detect controller coupled to the frequency acquisition loop to detect a frequency lock condition in a frequency lock mode and a data lock condition in the data phase lock mode based on the first feedback clock and the reference clock;
wherein the data lock phase loop comprises:
a decision-directed phase detector (DDPD) coupled to a finite impulse response (FIR) filter clocked by the second feedback clock to generate the phase error signal using a minimum mean square error (MMSE) criteria, the phase error signal including first and second phase error signals; and
a linear trans-conductor coupled to the DDPD to generate a differential current from the phase error signal, the differential current corresponding to the driving signal that controls the multi-band VCO; and
wherein the DDPD comprises:
a first phase error circuit to generate a first re-timed amplitude error and a first re-timed binary slope from a first data sample from the FIR filter;
a second phase error circuit to generate a second re-timed amplitude error and a second re-timed binary slope from a second data sample from the FIR filter;
a first multiplier to multiply the first re-timed amplitude error and the second re-timed binary slope to generate the first phase error signal; and
a second multiplier to multiply the second re-timed amplitude error and the first re-timed binary slope to generate the second phase error signal.

7. The apparatus of claim 6 wherein the first phase error circuit comprises:
a re-timer to adjust the first data sample to a sample $y(n)$;
a slicer coupled to the re-timer to generate a delayed ideal data sample delayed by P cycles $y^*(n-P)$ from the sample $y(n)$;
a delay to delay the sample $y(n)$ to $y(n-P)$;
an amplitude subtractor coupled to the slicer and the delay to generate an amplitude error;
a re-timing and amplifying circuit to re-time and amplify the amplitude error to generate the first re-timed amplitude error;
a slope subtractor coupled to the delay and the re-timer to generate a difference between $y(n-P)$ and $y(n)$;
a sign comparator coupled to the slope subtractor to generate a sign of the difference;
a synchronizer coupled to the sign comparator to generate the first re-timed binary slope synchronous with the first re-timed amplitude error.

8. The apparatus of claim 7 wherein the slicer comprises:
an analog-to-digital converter (ADC) to convert the sample $y(n)$ to N levels according to a partial response polynomial;
N quantizers coupled to the ADC to quantize the N levels;
N synchronizers coupled to the N quantizers to delay the N quantized levels by P cycles; and
a digital-to-analog converter (DAC) to convert the delayed N quantized levels to the delayed ideal data sample $y^*(n-P)$.

9. The apparatus of claim 6 wherein the second phase error circuit comprises:
a re-timer to adjust the second data sample to a sample $y(n)$;
a slicer coupled to the re-timer to generate a delayed ideal data sample delayed by P cycles $y^*(n-P)$ from the sample $y(n)$;
a delay to delay the sample $y(n)$ to $y(n-P)$;
an amplitude subtractor coupled to the slicer and the delay to generate an amplitude error;
a re-timing and amplifying circuit to re-time and amplify the amplitude error to generate the second re-timed amplitude error;
a slope subtractor coupled to the delay and the re-timer to generate a difference between $y(n-P)$ and $y(n)$;
a sign comparator coupled to the slope subtractor to generate a sign of the difference;
a synchronizer coupled to the sign comparator to generate the second re-timed binary slope synchronous with the second re-timed amplitude error.

10. The apparatus of claim 9 wherein the slicer comprises:
an analog-to-digital converter (ADC) to convert the sample $y(n)$ to N levels according to a partial response polynomial;
N quantizers coupled to the ADC to quantize the N levels;
N synchronizers coupled to the N quantizers to delay the N quantized levels by P cycles; and
a digital-to-analog converter (DAC) to convert the delayed N quantized levels to the delayed ideal data sample $y^*(n-P)$.

11. A method comprising:
locking a voltage controlled oscillator (VCO) clock in a zone lock frequency band from a plurality of frequency bands of a multi-band VCO to a reference clock using a frequency acquisition loop, the frequency acquisition loop generating first and second feedback clocks from the VCO clock, the zone lock frequency band having a smallest frequency difference between the first feedback clock and the reference clock;

generating a driving signal corresponding to a phase error signal from interleaved partial response signal (PRS) samples based on the second feedback clock using a data lock phase loop, the driving signal controlling the multi-band VCO in a data phase lock mode; and detecting a frequency lock condition in a frequency lock mode and a data lock condition in the data phase lock mode based on the first feedback clock and the reference clock using a lock detect controller;

wherein locking the VCO clock comprises:

dividing the VCO clock to provide the first and second feedback clocks;

filtering a control signal using a loop filter, the filtered control signal controlling the multi-band VCO;

selecting the control signal from a common mode signal using a loop multiplexer, a frequency error signal, and the driving signal based on a multiplexer select code; and providing the frequency error signal based on the reference clock and the first feedback clock using a phase frequency detector (PFD) and a charge pump.

12. The method of claim 11 wherein detecting a frequency lock condition in a frequency lock mode and a data lock condition in the data phase lock mode comprises:

comparing the first feedback clock and the reference clock, the comparator generating a lock signal when a frequency difference of first feedback clock and the reference clock is less than a threshold value;

controlling the loop multiplexer and the multi-band VCO based on the lock signal and configuration bits; and providing the configuration bits using a configuration register.

13. The method of claim 12 wherein controlling the loop multiplexer and the multi-band VCO comprises:

selecting the zone lock frequency band from the plurality of frequency bands of the multi-band VCO using a frequency coarse tuning circuit;

asserting the frequency lock condition using the selected zone lock frequency band; and asserting the data lock condition.

14. The method of claim 12 wherein controlling the loop multiplexer and the multi-band VCO comprises generating the multiplexer select code to select the common mode signal, a frequency error signal, and the driving signal corresponding to the frequency coarse tuning circuit, the frequency fine tuning circuit, and the data phase lock control circuit, respectively.

15. The method of claim 11 wherein generating the driving signal corresponding to the phase error signal comprises:

generating the phase error signal using a minimum mean square error (MMSE) criteria in a decision-directed phase detector (DDPD), the DDPD receiving data samples from a finite impulse response (FIR) filter clocked by the second feedback clock to, the phase error signal including first and second phase error signals; and generating a differential current from the phase error signal using a linear trans-conductor, the differential current corresponding to the driving signal that controls the multi-band VCO.

16. A method comprising:

locking a voltage controlled oscillator (VCO) clock in a zone lock frequency band from a plurality of frequency bands of a multi-band VCO to a reference clock using a frequency acquisition loop, the frequency acquisition loop generating first and second feedback clocks from the VCO clock, the zone lock frequency band having a smallest frequency difference between the first feedback clock and the reference clock;

generating a driving signal corresponding to a phase error signal from interleaved partial response signal (PRS) samples based on the second feedback clock using a data lock phase loop, the driving signal controlling the multi-band VCO in a data phase lock mode; and detecting a frequency lock condition in a frequency lock mode and a data lock condition in the data phase lock mode based on the first feedback clock and the reference clock using a lock detect controller;

wherein generating the driving signal corresponding to the phase error signal comprises:

generating the phase error signal using a minimum mean square error (MMSE) criteria in a decision-directed phase detector (DDPD), the DDPD receiving data samples from a finite impulse response (FIR) filter clocked by the second feedback clock to, the phase error signal including first and second phase error signals; and generating a differential current from the phase error signal using a linear trans-conductor, the differential current corresponding to the driving signal that controls the multi-band VCO; and wherein generating the phase error signal comprises:

generating a first re-timed amplitude error and a first re-timed binary slope from a first data sample from the FIR filter;

generating a second re-timed amplitude error and a second re-timed binary slope from a second data sample from the FIR filter;

multiplying the first re-timed amplitude error and the second re-timed binary slope to generate the first phase error signal; and multiplying the second re-timed amplitude error and the first re-timed binary slope to generate the second phase error signal.

17. The method of claim 16 wherein generating the first re-timed amplitude error and the first re-timed binary slope comprises:

adjusting the first data sample to a sample y(n);

generating a delayed ideal data sample delayed by P cycles y*(n−P) from the sample y(n);

delaying the sample y(n) to y(n−P);

generating an amplitude error;

re-timing and amplifying the amplitude error to generate the first re-timed amplitude error;

generating a difference between y(n−P) and y(n);

generating a sign of the difference;

generating the first re-timed binary slope synchronous with the first re-timed amplitude error.

18. The method of claim 17 wherein generating the delayed ideal data sample comprises:

converting the sample y(n) to N levels according to a partial response polynomial;

quantizing the N levels;

delaying the N quantized levels by P cycles; and converting the delayed N quantized levels to the delayed ideal data sample y*(n−P).

19. The method of claim 16 wherein the second phase error circuit comprises:

adjusting the second data sample to a sample y(n);

generating a delayed ideal data sample delayed by P cycles y*(n−P) from the sample y(n);

delaying the sample y(n) to y(n−P);

generating an amplitude error;

re-timing and amplifying the amplitude error to generate the second re-timed amplitude error;

generating a difference between y(n–P) and y(n);
generating a sign of the difference;
generating the second re-timed binary slope synchronous with the second re-timed amplitude error.

20. The method of claim 19 wherein generating the delayed ideal data sample comprises:
converting the sample y(n) to N levels according to a partial response polynomial;
quantizing the N levels;
delaying the N quantized levels by P cycles; and
converting the delayed N quantized levels to the delayed ideal data sample y*(n–P).

21. A system comprising:
a variable gain amplifier (VGA) to amplify received optical data from a receiver optical channel;
a continuous time filter (CTF) coupled to the VGA to equalize the received optical data;
a finite impulse response (FIR) filter coupled to the CTF to generate interleaved partial response signal (PRS) samples;
a maximum likelihood (ML) sequence detector coupled to the FIR filter to recover the received samples; and
a timing recovery circuit (TRC) coupled to the FIR filter and the ML sequence detector to recover timing signal for the FIR filter and the sequence detector, the TRC comprising:
a frequency acquisition loop to lock a voltage controlled oscillator (VCO) clock in a zone lock frequency band from a plurality of frequency bands of a multi-band VCO to a reference clock, the frequency acquisition loop generating first and second feedback clocks from the VCO clock, the zone lock frequency band having a smallest frequency difference between the first feedback clock and the reference clock,
a data lock phase loop coupled to the frequency acquisition loop to generate a driving signal corresponding to a phase error signal from the interleaved PRS samples based on the second feedback clock, the driving signal controlling the multi-band VCO in a data phase lock mode, and
a lock detect controller coupled to the frequency acquisition loop to detect a frequency lock condition in a frequency lock mode and a data lock condition in the data phase lock mode based on the first feedback clock and the reference clock;
wherein the frequency acquisition loop comprises:
a divider to divide the VCO clock to provide the first and second feedback clocks;
a loop filter coupled to the multi-band VCO to filter a control signal, the filtered control signal controlling the multi-band VCO;
a loop multiplexer coupled to the loop filter to select the control signal from a common mode signal, a frequency error signal, and the driving signal based on a multiplexer select code; and
a phase frequency detector (PFD) and a charge pump coupled to the loop multiplexer and the divider to provide the frequency error signal based on the reference clock and the first feedback clock.

22. The system of claim 21 wherein the lock detect controller comprises:
a comparator to compare the first feedback clock and the reference clock, the comparator generating a lock signal when a frequency difference of first feedback clock and the reference clock is less than a threshold value;
a control circuit coupled to the comparator to generate the multiplexer select code and band select code to the multi-band VCO based on the lock signal and configuration bits; and
a configuration register coupled to the control circuit to provide the configuration bits.

23. The system of claim 22 wherein the control circuit comprises:
a frequency coarse tuning circuit to select the zone lock frequency band from the plurality of frequency bands of the multi-band VCO, the zone lock frequency band having a smallest frequency difference between the first feedback clock and the reference clock;
a frequency fine tuning circuit coupled to the frequency coarse tuning circuit to assert or de-assert the frequency lock condition using the selected zone lock frequency band; and
a data phase lock control circuit coupled to the frequency fine tuning circuit to assert or de-assert the data lock condition.

24. The system of claim 22 wherein the control circuit generates the multiplexer select code to the loop multiplexer to select the common mode signal, a frequency error signal, and the driving signal corresponding to the frequency coarse tuning circuit, the frequency fine tuning circuit, and the data phase lock control circuit, respectively.

25. The system of claim 21 wherein the data lock phase loop comprises:
a decision-directed phase detector (DDPD) coupled to the FIR filter clocked by the second feedback clock to generate the phase error signal using a minimum mean square error (MMSE) criteria, the phase error signal including first and second phase error signals; and
a linear trans-conductor coupled to the DDPD to generate a differential current from the phase error signal, the differential current corresponding to the driving signal that controls the multi-band VCO.

26. A system comprising:
a variable gain amplifier (VGA) to amplify received optical data from a receiver optical channel;
a continuous time filter (CTF) coupled to the VGA to equalize the received optical data;
a finite impulse response (FIR) filter coupled to the CTF to generate interleaved partial response signal (PRS) samples;
a maximum likelihood (ML) sequence detector coupled to the FIR filter to recover the received samples; and
a timing recovery circuit (TRC) coupled to the FIR filter and the ML sequence detector to recover timing signal for the FIR filter and the sequence detector, the TRC comprising:
a frequency acquisition loop to lock a voltage controlled oscillator (VCO) clock in a zone lock frequency band from a plurality of frequency bands of a multi-band VCO to a reference clock, the frequency acquisition loop generating first and second feedback clocks from the VCO clock, the zone lock frequency band having a smallest frequency difference between the first feedback clock and the reference clock,
a data lock phase loop coupled to the frequency acquisition loop to generate a driving signal corresponding to a phase error signal from the interleaved PRS samples based on the second feedback clock, the driving signal controlling the multi-band VCO in a data phase lock mode, and
a lock detect controller coupled to the frequency acquisition loop to detect a frequency lock condition in a frequency lock mode and a data lock condition in the data phase lock mode based on the first feedback clock and the reference clock;

wherein the data lock phase loop comprises:
a decision-directed phase detector (DDPD) coupled to the FIR filter clocked by the second feedback clock to generate the phase error signal using a minimum mean square error (MMSE) criteria, the phase error signal including first and second phase error signals; and
a linear trans-conductor coupled to the DDPD to generate a differential current from the phase error signal, the differential current corresponding to the driving signal that controls the multi-band VCO; and wherein the DDPD comprises:
a first phase error circuit to generate a first re-timed amplitude error and a first re-timed binary slope from a first data sample from the FIR filter;
a second phase error circuit to generate a second re-timed amplitude error and a second re-timed binary slope from a second data sample from the FIR filter;
a first multiplier to multiply the first re-timed amplitude error and the second re-timed binary slope to generate the first phase error signal; and
a second multiplier to multiply the second re-timed amplitude error and the first re-timed binary slope to generate the second phase error signal.

27. The apparatus of claim 6 wherein the frequency acquisition loop comprises:
a divider to divide the VCO clock to provide the first and second feedback clocks;
a loop filter coupled to the multi-band VCO to filter a control signal, the filtered control signal controlling the multi-band VCO;
a loop multiplexer coupled to the loop filter to select the control signal from a common mode signal, a frequency error signal, and the driving signal based on a multiplexer select code; and
a phase frequency detector (PFD) and a charge pump coupled to the loop multiplexer and the divider to provide the frequency error signal based on the reference clock and the first feedback clock.

28. The apparatus of claim 27 wherein the lock detect controller comprises:
a comparator to compare the first feedback clock and the reference clock, the comparator generating a lock signal when a frequency difference of first feedback clock and the reference clock is less than a threshold value;
a control circuit coupled to the comparator to generate the multiplexer select code and band select code to the multi-band VCO based on the lock signal and configuration bits; and
a configuration register coupled to the control circuit to provide the configuration bits.

29. The apparatus of claim 28 wherein the control circuit comprises:
a frequency coarse tuning circuit to select the zone lock frequency band from the plurality of frequency bands of the multi-band VCO;
a frequency fine tuning circuit coupled to the frequency coarse tuning circuit to assert or de-assert the frequency lock condition using the selected zone lock frequency band; and
a data phase lock control circuit coupled to the frequency fine tuning circuit to assert or de-assert the data lock condition.

30. The apparatus of claim 28 wherein the control circuit generates the multiplexer select code to the loop multiplexer to select the common mode signal, a frequency error signal, and the driving signal corresponding to the frequency coarse tuning circuit, the frequency fine tuning circuit, and the data phase lock control circuit, respectively.

31. The method of claim 16 wherein locking the VCO clock comprises:
dividing the VCO clock to provide the first and second feedback clocks;
filtering a control signal using a loop filter, the filtered control signal controlling the multi-band VCO;
selecting the control signal from a common mode signal using a loop multiplexer, a frequency error signal, and the driving signal based on a multiplexer select code; and
providing the frequency error signal based on the reference clock and the first feedback clock using a phase frequency detector (PFD) and a charge pump.

32. The method of claim 31 wherein detecting a frequency lock condition in a frequency lock mode and a data lock condition in the data phase lock mode comprises:
comparing the first feedback clock and the reference clock, the comparator generating a lock signal when a frequency difference of first feedback clock and the reference clock is less than a threshold value;
controlling the loop multiplexer and the multi-band VCO based on the lock signal and configuration bits; and
providing the configuration bits using a configuration register.

33. The method of claim 32 wherein controlling the loop multiplexer and the multi-band VCO comprises:
selecting the zone lock frequency band from the plurality of frequency bands of the multi-band VCO using a frequency coarse tuning circuit;
asserting the frequency lock condition using the selected zone lock frequency band; and
asserting the data lock condition.

34. The method of claim 32 wherein controlling the loop multiplexer and the multi-band VCO comprises generating the multiplexer select code to select the common mode signal, a frequency error signal, and the driving signal corresponding to the frequency coarse tuning circuit, the frequency fine tuning circuit, and the data phase lock control circuit, respectively.

35. The system of claim 26 wherein the frequency acquisition loop comprises:
a divider to divide the VCO clock to provide the first and second feedback clocks;
a loop filter coupled to the multi-band VCO to filter a control signal, the filtered control signal controlling the multi-band VCO;
a loop multiplexer coupled to the loop filter to select the control signal from a common mode signal, a frequency error signal, and the driving signal based on a multiplexer select code; and
a phase frequency detector (PFD) and a charge pump coupled to the loop multiplexer and the divider to provide the frequency error signal based on the reference clock and the first feedback clock.

36. The system of claim 35 wherein the lock detect controller comprises:
a comparator to compare the first feedback clock and the reference clock, the comparator generating a lock signal when a frequency difference of first feedback clock and the reference clock is less than a threshold value;

a control circuit coupled to the comparator to generate the multiplexer select code and band select code to the multi-band VCO based on the lock signal and configuration bits; and a configuration register coupled to the control circuit to provide the configuration bits.

37. The system of claim 36 wherein the control circuit comprises:

a frequency coarse tuning circuit to select the zone lock frequency band from the plurality of frequency bands of the multi-band VCO, the zone lock frequency band having a smallest frequency difference between the first feedback clock and the reference clock;

a frequency fine tuning circuit coupled to the frequency coarse tuning circuit to assert or de-assert the frequency lock condition using the selected zone lock frequency band; and a data phase lock control circuit coupled to the frequency fine tuning circuit to assert or de-assert the data lock condition.

38. The system of claim 36 wherein the control circuit generates the multiplexer select code to the loop multiplexer to select the common mode signal, a frequency error signal, and the driving signal corresponding to the frequency coarse tuning circuit, the frequency fine tuning circuit, and the data phase lock control circuit, respectively.

* * * * *